(12) United States Patent
Neagoe et al.

(10) Patent No.: US 8,248,286 B2
(45) Date of Patent: Aug. 21, 2012

(54) SPLIT WIPER DIGITAL POTENTIOMETER AND METHOD

(75) Inventors: Otilia Neagoe, Bucharest (RO); Radu H. Iacob, Santa Clara, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 85 days.

(21) Appl. No.: 12/846,668

(22) Filed: Jul. 29, 2010

(65) Prior Publication Data

US 2012/0026025 A1    Feb. 2, 2012

(51) Int. Cl.
*H03M 1/66* (2006.01)

(52) U.S. Cl. .................. 341/144; 324/723; 368/162

(58) Field of Classification Search .................. 341/155, 341/154, 172, 144, 145; 324/723; 338/162, 338/15
See application file for complete search history.

(56) References Cited

U.S. PATENT DOCUMENTS

| | | | |
|---|---|---|---|
| 7,005,837 B2 | 2/2006 | Stanescu et al. | |
| 7,012,555 B2 | 3/2006 | Voicu et al. | |
| 7,042,380 B2 * | 5/2006 | Iacob et al. | 341/154 |
| 7,345,611 B2 | 3/2008 | Voicu et al. | |
| 7,535,395 B2 | 5/2009 | Voicu et al. | |
| 7,667,567 B2 * | 2/2010 | Saracco | 338/162 |

OTHER PUBLICATIONS

ON Semiconductor, CAT5140 Single Channel 256 Tap DPP with Integrated EEPROM and I2C Control, Semiconductor Components Industries, LLC, May 2009—Rev. 0.
Radu H. Iacob, Multistage Architectures for High Resolution Digital Potentiometers, 2009, IEEE.

\* cited by examiner

*Primary Examiner* — Peguy Jean Pierre
(74) *Attorney, Agent, or Firm* — Rennie William Dover

(57) ABSTRACT

A potentiometer and a method for adjusting an impedance. In accordance with an embodiment, the potentiometer may be a programmable multistage digital potentiometer that has a first stage comprising a non-shunted impedance, a second stage coupled between a reference terminal and the first stage, and a third stage coupled between the first stage and another reference terminal. In accordance with another embodiment, the potentiometer receives a wiper address and parses it into sections such that one section controls the first stage, a second portion controls portions of the second and third stages, and a third portion controls the other portions of the second and third stages to produce a desired impedance between a common wiper terminal and the reference terminals.

24 Claims, 13 Drawing Sheets

FIG. 4A

| 1 | =CLOSE |
|---|---|
| 0 | =OPEN |

| K | SMSBL | SL | | | | | SWL | | | | | SWH | | | | | SH | | | | | SMSBH |
|---|---|---|---|---|---|---|---|---|---|---|---|---|---|---|---|---|---|---|---|---|---|---|
| | | (1) | (2) | (3) | ... | (7) | (1) | (2) | (3) | ... | (16) | (1) | (2) | (3) | ... | (16) | (1) | (2) | (3) | ... | (7) | |
| 0 | 1 | 1 | 1 | 1 | ... | 1 | 1 | 0 | 0 | ... | 0 | 1 | 0 | 0 | ... | 0 | 0 | 0 | 0 | ... | 0 | 0 |
| 1 | 1 | 1 | 1 | 1 | ... | 1 | 0 | 1 | 0 | ... | 0 | 0 | 1 | 0 | ... | 0 | 0 | 0 | 0 | ... | 0 | 0 |
| 2 | 1 | 1 | 1 | 1 | ... | 1 | 0 | 0 | 1 | ... | 0 | 0 | 0 | 1 | ... | 0 | 0 | 0 | 0 | ... | 0 | 0 |
| ... | ... | ... | ... | ... | ... | ... | ... | ... | ... | ... | ... | ... | ... | ... | ... | ... | ... | ... | ... | ... | ... | ... |
| 15 | 1 | 1 | 1 | 1 | ... | 1 | 0 | 0 | 0 | ... | 1 | 0 | 0 | 0 | ... | 1 | 0 | 0 | 0 | ... | 0 | 0 |
| 16 | 1 | 1 | 1 | 1 | ... | 0 | 1 | 0 | 0 | ... | 0 | 1 | 0 | 0 | ... | 0 | 1 | 0 | 0 | ... | 0 | 0 |
| 17 | 1 | 1 | 1 | 1 | ... | 0 | 0 | 1 | 0 | ... | 0 | 0 | 1 | 0 | ... | 0 | 1 | 0 | 0 | ... | 0 | 0 |
| 18 | 1 | 1 | 1 | 1 | ... | 0 | 0 | 0 | 1 | ... | 0 | 0 | 0 | 1 | ... | 0 | 1 | 0 | 0 | ... | 0 | 0 |
| ... | ... | ... | ... | ... | ... | ... | ... | ... | ... | ... | ... | ... | ... | ... | ... | ... | ... | ... | ... | ... | ... | ... |
| 31 | 1 | 1 | 1 | 1 | ... | 0 | 0 | 0 | 0 | ... | 1 | 0 | 0 | 0 | ... | 1 | 1 | 0 | 0 | ... | 0 | 0 |
| 32 | 1 | 1 | 1 | 1 | ... | 0 | 1 | 0 | 0 | ... | 0 | 1 | 0 | 0 | ... | 0 | 1 | 1 | 0 | ... | 0 | 0 |
| 33 | 1 | 1 | 1 | 1 | ... | 0 | 0 | 1 | 0 | ... | 0 | 0 | 1 | 0 | ... | 0 | 1 | 1 | 0 | ... | 0 | 0 |
| 34 | 1 | 1 | 1 | 1 | ... | 0 | 0 | 0 | 1 | ... | 0 | 0 | 0 | 1 | ... | 0 | 1 | 1 | 0 | ... | 0 | 0 |
| ... | ... | ... | ... | ... | ... | ... | ... | ... | ... | ... | ... | ... | ... | ... | ... | ... | ... | ... | ... | ... | ... | ... |
| 47 | 1 | 1 | 1 | 1 | ... | 0 | 0 | 0 | 0 | ... | 1 | 0 | 0 | 0 | ... | 1 | 1 | 1 | 0 | ... | 0 | 0 |
| 48 | 1 | 1 | 1 | 1 | ... | 0 | 1 | 0 | 0 | ... | 0 | 1 | 0 | 0 | ... | 0 | 1 | 1 | 1 | ... | 0 | 0 |
| 49 | 1 | 1 | 1 | 1 | ... | 0 | 0 | 1 | 0 | ... | 0 | 0 | 1 | 0 | ... | 0 | 1 | 1 | 1 | ... | 0 | 0 |
| 50 | 1 | 1 | 1 | 1 | ... | 0 | 0 | 0 | 1 | ... | 0 | 0 | 0 | 1 | ... | 0 | 1 | 1 | 1 | ... | 0 | 0 |
| ... | ... | ... | ... | ... | ... | ... | ... | ... | ... | ... | ... | ... | ... | ... | ... | ... | ... | ... | ... | ... | ... | ... |
| 63 | 1 | 1 | 1 | 1 | ... | 0 | 0 | 0 | 0 | ... | 1 | 0 | 0 | 0 | ... | 1 | 1 | 1 | 1 | ... | 0 | 0 |
| 64 | 1 | 1 | 1 | 1 | ... | 0 | 1 | 0 | 0 | ... | 0 | 1 | 0 | 0 | ... | 0 | 1 | 1 | 1 | ... | 0 | 0 |
| 65 | 1 | 1 | 1 | 1 | ... | 0 | 0 | 1 | 0 | ... | 0 | 0 | 1 | 0 | ... | 0 | 1 | 1 | 1 | ... | 0 | 0 |
| 66 | 1 | 1 | 1 | 1 | ... | 0 | 0 | 0 | 1 | ... | 0 | 0 | 0 | 1 | ... | 0 | 1 | 1 | 1 | ... | 0 | 0 |
| ... | ... | ... | ... | ... | ... | ... | ... | ... | ... | ... | ... | ... | ... | ... | ... | ... | ... | ... | ... | ... | ... | ... |
| 79 | 1 | 1 | 1 | 1 | ... | 0 | 0 | 0 | 0 | ... | 1 | 0 | 0 | 0 | ... | 1 | 1 | 1 | 1 | ... | 0 | 0 |
| 80 | 1 | 1 | 1 | 0 | ... | 0 | 1 | 0 | 0 | ... | 0 | 1 | 0 | 0 | ... | 0 | 1 | 1 | 1 | ... | 0 | 0 |
| 81 | 1 | 1 | 1 | 0 | ... | 0 | 0 | 1 | 0 | ... | 0 | 0 | 1 | 0 | ... | 0 | 1 | 1 | 1 | ... | 0 | 0 |
| 82 | 1 | 1 | 1 | 0 | ... | 0 | 0 | 0 | 1 | ... | 0 | 0 | 0 | 1 | ... | 0 | 1 | 1 | 1 | ... | 0 | 0 |
| ... | ... | ... | ... | ... | ... | ... | ... | ... | ... | ... | ... | ... | ... | ... | ... | ... | ... | ... | ... | ... | ... | ... |
| 95 | 1 | 1 | 1 | 0 | ... | 0 | 0 | 0 | 0 | ... | 1 | 0 | 0 | 0 | ... | 1 | 1 | 1 | 1 | ... | 0 | 0 |
| 96 | 1 | 1 | 0 | 0 | ... | 0 | 1 | 0 | 0 | ... | 0 | 1 | 0 | 0 | ... | 0 | 1 | 1 | 1 | ... | 0 | 0 |
| 97 | 1 | 1 | 0 | 0 | ... | 0 | 0 | 1 | 0 | ... | 0 | 0 | 1 | 0 | ... | 0 | 1 | 1 | 1 | ... | 0 | 0 |
| 98 | 1 | 1 | 0 | 0 | ... | 0 | 0 | 0 | 1 | ... | 0 | 0 | 0 | 1 | ... | 0 | 1 | 1 | 1 | ... | 0 | 0 |
| ... | ... | ... | ... | ... | ... | ... | ... | ... | ... | ... | ... | ... | ... | ... | ... | ... | ... | ... | ... | ... | ... | ... |
| 111 | 1 | 1 | 0 | 0 | ... | 0 | 0 | 0 | 0 | ... | 1 | 0 | 0 | 0 | ... | 1 | 1 | 1 | 1 | ... | 0 | 0 |
| 112 | 1 | 0 | 0 | 0 | ... | 0 | 1 | 0 | 0 | ... | 0 | 1 | 0 | 0 | ... | 0 | 1 | 1 | 1 | ... | 1 | 0 |
| 113 | 1 | 0 | 0 | 0 | ... | 0 | 0 | 1 | 0 | ... | 0 | 0 | 1 | 0 | ... | 0 | 1 | 1 | 1 | ... | 1 | 0 |
| 114 | 1 | 0 | 0 | 0 | ... | 0 | 0 | 0 | 1 | ... | 0 | 0 | 0 | 1 | ... | 0 | 1 | 1 | 1 | ... | 1 | 0 |
| ... | ... | ... | ... | ... | ... | ... | ... | ... | ... | ... | ... | ... | ... | ... | ... | ... | ... | ... | ... | ... | ... | ... |
| 127 | 1 | 0 | 0 | 0 | ... | 0 | 0 | 0 | 0 | ... | 1 | 0 | 0 | 0 | ... | 1 | 1 | 1 | 1 | ... | 1 | 0 |

FIG. 4B

| | | | | | | | | | | | | | | | | | | | |
|---|---|---|---|---|---|---|---|---|---|---|---|---|---|---|---|---|---|---|---|
| 128 | 0 | 1 | 1 | 1 | ... | 1 | 1 | 0 | 0 | ... | 0 | 1 | 0 | 0 | ... | 0 | 0 | 0 | 0 | ... | 0 | 1 |
| 129 | 0 | 1 | 1 | 1 | ... | 1 | 0 | 1 | 0 | ... | 0 | 0 | 1 | 0 | ... | 0 | 0 | 0 | 0 | ... | 0 | 1 |
| 130 | 0 | 1 | 1 | 1 | ... | 1 | 0 | 0 | 1 | ... | 0 | 0 | 0 | 1 | ... | 0 | 0 | 0 | 0 | ... | 0 | 1 |
| ... | ... | ... | ... | ... | ... | ... | ... | ... | ... | ... | ... | ... | ... | ... | ... | ... | ... | ... | ... | ... | ... | ... |
| 143 | 0 | 1 | 1 | 1 | ... | 1 | 0 | 0 | 0 | ... | 1 | 0 | 0 | 0 | ... | 1 | 0 | 0 | 0 | ... | 0 | 1 |
| 144 | 0 | 1 | 1 | 1 | ... | 0 | 1 | 0 | 0 | ... | 0 | 1 | 0 | 0 | ... | 0 | 1 | 0 | 0 | ... | 0 | 1 |
| 145 | 0 | 1 | 1 | 1 | ... | 0 | 0 | 1 | 0 | ... | 0 | 0 | 1 | 0 | ... | 0 | 1 | 0 | 0 | ... | 0 | 1 |
| 146 | 0 | 1 | 1 | 1 | ... | 0 | 0 | 0 | 1 | ... | 0 | 0 | 0 | 1 | ... | 0 | 1 | 0 | 0 | ... | 0 | 1 |
| ... | ... | ... | ... | ... | ... | ... | ... | ... | ... | ... | ... | ... | ... | ... | ... | ... | ... | ... | ... | ... | ... | ... |
| 159 | 0 | 1 | 1 | 1 | ... | 0 | 0 | 0 | 0 | ... | 1 | 0 | 0 | 0 | ... | 1 | 1 | 0 | 0 | ... | 0 | 1 |
| 160 | 0 | 1 | 1 | 1 | ... | 0 | 1 | 0 | 0 | ... | 0 | 1 | 0 | 0 | ... | 0 | 1 | 1 | 0 | ... | 0 | 1 |
| 161 | 0 | 1 | 1 | 1 | ... | 0 | 0 | 1 | 0 | ... | 0 | 0 | 1 | 0 | ... | 0 | 1 | 1 | 0 | ... | 0 | 1 |
| 162 | 0 | 1 | 1 | 1 | ... | 0 | 0 | 0 | 1 | ... | 0 | 0 | 0 | 1 | ... | 0 | 1 | 1 | 0 | ... | 0 | 1 |
| ... | ... | ... | ... | ... | ... | ... | ... | ... | ... | ... | ... | ... | ... | ... | ... | ... | ... | ... | ... | ... | ... | ... |
| 175 | 0 | 1 | 1 | 1 | ... | 0 | 0 | 0 | 0 | ... | 1 | 0 | 0 | 0 | ... | 1 | 1 | 1 | 0 | ... | 0 | 1 |
| 176 | 0 | 1 | 1 | 1 | ... | 0 | 1 | 0 | 0 | ... | 0 | 1 | 0 | 0 | ... | 0 | 1 | 1 | 1 | ... | 0 | 1 |
| 177 | 0 | 1 | 1 | 1 | ... | 0 | 0 | 1 | 0 | ... | 0 | 0 | 1 | 0 | ... | 0 | 1 | 1 | 1 | ... | 0 | 1 |
| 178 | 0 | 1 | 1 | 1 | ... | 0 | 0 | 0 | 1 | ... | 0 | 0 | 0 | 1 | ... | 0 | 1 | 1 | 1 | ... | 0 | 1 |
| ... | ... | ... | ... | ... | ... | ... | ... | ... | ... | ... | ... | ... | ... | ... | ... | ... | ... | ... | ... | ... | ... | ... |
| 191 | 0 | 1 | 1 | 1 | ... | 0 | 0 | 0 | 0 | ... | 1 | 0 | 0 | 0 | ... | 1 | 1 | 1 | 1 | ... | 0 | 1 |
| 192 | 0 | 1 | 1 | 1 | ... | 0 | 1 | 0 | 0 | ... | 0 | 1 | 0 | 0 | ... | 0 | 1 | 1 | 1 | ... | 0 | 1 |
| 193 | 0 | 1 | 1 | 1 | ... | 0 | 0 | 1 | 0 | ... | 0 | 0 | 1 | 0 | ... | 0 | 1 | 1 | 1 | ... | 0 | 1 |
| 194 | 0 | 1 | 1 | 1 | ... | 0 | 0 | 0 | 1 | ... | 0 | 0 | 0 | 1 | ... | 0 | 1 | 1 | 1 | ... | 0 | 1 |
| ... | ... | ... | ... | ... | ... | ... | ... | ... | ... | ... | ... | ... | ... | ... | ... | ... | ... | ... | ... | ... | ... | ... |
| 207 | 0 | 1 | 1 | 1 | ... | 0 | 0 | 0 | 0 | ... | 1 | 0 | 0 | 0 | ... | 1 | 1 | 1 | 1 | ... | 0 | 1 |
| 208 | 0 | 1 | 1 | 0 | ... | 0 | 1 | 0 | 0 | ... | 0 | 1 | 0 | 0 | ... | 0 | 1 | 1 | 1 | ... | 0 | 1 |
| 209 | 0 | 1 | 1 | 0 | ... | 0 | 0 | 1 | 0 | ... | 0 | 0 | 1 | 0 | ... | 0 | 1 | 1 | 1 | ... | 0 | 1 |
| 210 | 0 | 1 | 1 | 0 | ... | 0 | 0 | 0 | 1 | ... | 0 | 0 | 0 | 1 | ... | 0 | 1 | 1 | 1 | ... | 0 | 1 |
| ... | ... | ... | ... | ... | ... | ... | ... | ... | ... | ... | ... | ... | ... | ... | ... | ... | ... | ... | ... | ... | ... | ... |
| 223 | 0 | 1 | 1 | 0 | ... | 0 | 0 | 0 | 0 | ... | 1 | 0 | 0 | 0 | ... | 1 | 1 | 1 | 1 | ... | 0 | 1 |
| 224 | 0 | 1 | 0 | 0 | ... | 0 | 1 | 0 | 0 | ... | 0 | 1 | 0 | 0 | ... | 0 | 1 | 1 | 1 | ... | 0 | 1 |
| 225 | 0 | 1 | 0 | 0 | ... | 0 | 0 | 1 | 0 | ... | 0 | 0 | 1 | 0 | ... | 0 | 1 | 1 | 1 | ... | 0 | 1 |
| 226 | 0 | 1 | 0 | 0 | ... | 0 | 0 | 0 | 1 | ... | 0 | 0 | 0 | 1 | ... | 0 | 1 | 1 | 1 | ... | 0 | 1 |
| ... | ... | ... | ... | ... | ... | ... | ... | ... | ... | ... | ... | ... | ... | ... | ... | ... | ... | ... | ... | ... | ... | ... |
| 239 | 0 | 1 | 0 | 0 | ... | 0 | 0 | 0 | 0 | ... | 1 | 0 | 0 | 0 | ... | 1 | 1 | 1 | 1 | ... | 0 | 1 |
| 240 | 0 | 0 | 0 | 0 | ... | 0 | 1 | 0 | 0 | ... | 0 | 1 | 0 | 0 | ... | 0 | 1 | 1 | 1 | ... | 1 | 1 |
| 241 | 0 | 0 | 0 | 0 | ... | 0 | 0 | 1 | 0 | ... | 0 | 0 | 1 | 0 | ... | 0 | 1 | 1 | 1 | ... | 1 | 1 |
| 242 | 0 | 0 | 0 | 0 | ... | 0 | 0 | 0 | 1 | ... | 0 | 0 | 0 | 1 | ... | 0 | 1 | 1 | 1 | ... | 1 | 1 |
| ... | ... | ... | ... | ... | ... | ... | ... | ... | ... | ... | ... | ... | ... | ... | ... | ... | ... | ... | ... | ... | ... | ... |
| 255 | 0 | 0 | 0 | 0 | ... | 0 | 0 | 0 | 0 | ... | 1 | 0 | 0 | 0 | ... | 1 | 1 | 1 | 1 | ... | 1 | 1 |

SPLIT WIPER DIGITAL POTENTIOMETER AND METHOD

BACKGROUND

The present invention relates, in general, to electronics and, more particularly, to potentiometers and methods for manufacturing potentiometers.

Potentiometers are electronic circuits that provide a variable impedance between two nodes. Digital potentiometers are electronic circuits that provide a variable impedance in accordance with a digital signal. A digital potentiometer has a fixed value impedance connected between two reference terminals. This impedance is provided by a string of impedance devices that can be selectively connected to a third terminal, called a wiper terminal, through electronic switches that are controlled by digital signals. Digital potentiometers can be used in digital-to-analog converters and as replacements for mechanical potentiometers and rheostats.

The fineness of adjustment, resolution, or "granularity" of a digital potentiometer is typically determined by the number of digital bits used for the selection of the desired wiper position. For instance, an eight bit wiper address allows for $2^8$, i.e., 256, different wiper impedance selections or wiper positions. A disadvantage of finer adjustment granularity (more digital bits) is a rapid increase in the number of components such as resistors, switches, decoding gates, or other logic devices required for implementation. The increase in the number of components typically results in larger and more expensive devices.

Accordingly, it would be advantageous to have a method and circuit for adjusting an impedance. It would be of further advantage for the method and circuit to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIGS. 4A-4B are charts of switch positions of the potentiometer of FIGS. 3A-3F.

DETAILED DESCRIPTION

Figure 1:
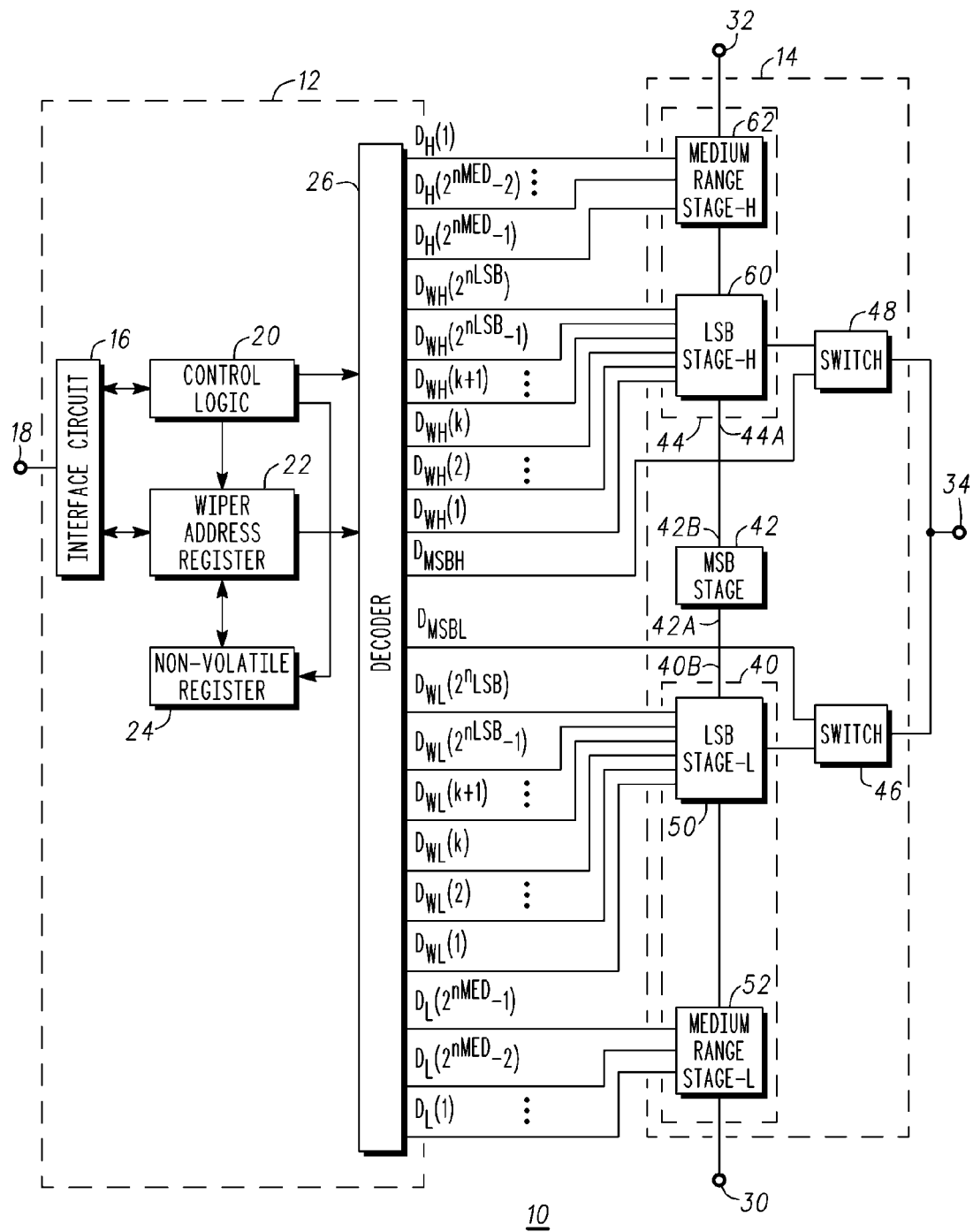
FIG. 1 is a circuit schematic of a potentiometer in accordance with an embodiment of the present invention.

The present description includes, among other features, a potentiometer and a method for adjusting an impedance. By way of example, the potentiometer may be a programmable multistage digital potentiometer which preferably has $2^n$ taps and at least three terminals: a higher terminal, a lower terminal, and a wiper terminal. It should be noted that the terms higher and lower for describing the terminals are not limiting terms with regards to the position or function of the terminals. The higher terminal is coupled to the lower terminal through a string of impedance elements. In accordance with embodiments in which the potentiometer is a programmable multistage digital potentiometer has $2^n$ taps, there are $2^n-1$ impedance elements, where n represents the number of bits used for identifying the position of the wiper terminal. This signal may be referred to as the wiper address (WA[n]:WA[0]). When the impedance element is a resistor and there are $(2^n-1)$ impedance elements between the upper and lower terminals, the nominal resistance value $R_{nom}$ between the upper and lower terminals is $(2^n-1)$ times $R_0$, where $R_0$ is a resistance value of a single impedance element. The $2^n$ taps can be connected one at time to the wiper terminal. It should be understood that the impedance element may be a resistor, a capacitor, an inductor, or combinations thereof. As those skilled in the art are aware, an impedance Z has a resistive part (R) and a reactive part (X), where Z=R+jX. In the case of a resistor, the reactive part (X) is zero whereas for a capacitor and an inductor the resistive part is zero such that the impedance of a capacitor or an inductor is purely imaginary. Thus, impedance is a term that encompasses both the resistance of resistors and the reactance of capacitors and inductors. Those skilled in the art are further aware that when modifying embodiments in which the impedance elements are resistors may require changing the impedance configuration when the resistive impedance such as a resistor is replaced by an impedance having a reactive part such as a capacitor. For instance, changing a string of resistors that are in series may require using a string of capacitors that are in parallel.

The exponent "n" or the number of bits that identify the position or location of the wiper terminal may be divided into portions that represent different stages of the programmable multistage digital potentiometer. For example, "n" can be divided as follows:

$$n = n_{MSB} + n_{MED} + n_{LSB} \qquad \text{EQT. 1}$$

where $n_{MSB}$ is a design parameter for a stage that represents the most significant bits, i.e., the MSB stage;

$n_{MED}$ is a design parameter for a stage that represents the medium range bits, i.e., the medium range stages; and $n_{LSB}$ is a design parameter for a stage that represents the least significant bits, i.e., the LSB range stages.

Because it is desirable to minimize the number of switches to lower the cost and area of the programmable multistage digital potentiometer and to increase its accuracy, $n_{MSB}$ is selected to have a minimum value, i.e., one. Thus, the whole range of impedance values can be divided into an upper range and a lower range. The remaining bits are split between $n_{MED}$ and $n_{LSB}$ such that:

$$n_{LSB} = n_{MED}; \text{ or} \qquad \text{EQT. 2}$$

$$n_{LSB} = n_{MED} + 1. \qquad \text{EQT. 3}$$

The number of bits for each stage can be determined using the relationship:

$$n = 1 + [(n-1)/2] + [n/2] \qquad \text{EQT. 4}$$

The value of "n" is determined from the number of taps for the programmable digital potentiometer. For example, in a programmable multistage digital potentiometer having 256 taps the value of "n" is 8, i.e., $2^8=256$, whereas for a programmable multistage digital potentiometer having 128 taps the value of "n" is 7, i.e., $2^7=128$.

In accordance with embodiments of the present invention, a programmable digital potentiometer having $2^n$ taps has $2^n-1$ impedance elements. To reduce and preferably minimize the number of switches, the most significant bit ($n_{MSB}$) of the n-bit word is selected to divide the range of the wiper address into a higher range and a lower range, i.e., $n_{MSB}$ is selected to be 1. Splitting the remaining bits of the n-bit wiper address between $n_{MED}$ and $n_{LSB}$ and combining EQT. 1 and EQT. 2 yields:

$$n_{MSB}=1 \qquad \text{EQT. 5}$$

$$n_{MED}=[(n-1)/2] \qquad \text{EQT. 6}$$

$$n_{LSB}=[n/2] \qquad \text{EQT. 7}$$

It should be understood that the number of bits represented by $n_{MED}$ is determined as $[(n-1)/2]$, where the brackets ("[ ]") serve as an arithmetic operator that rounds down the number within the brackets to the nearest integer if the number within the brackets is not already an integer. For example, if n=8, then $[(n-1)/2]=[(8-1)/2]=[3.5]=3$, i.e., 3.5 is rounded down to the nearest integer which is 3. Therefore the number of bits represented by $n_{MED}$ is 3, i.e., $n_{MED}$ is represented by 3 of the 8 wiper bits. The number of bits of the wiper address represented by $n_{LSB}$ is determined by $[n/2]=[8/2]=4$. Accordingly, the number of bits of the wiper address represented by $n_{LSB}$ is 4, i.e., $n_{LSB}$ is represented by 4 of the 8 wiper bits. For the sake of completeness, the number of bits of the wiper address represented by $n_{MSB}$ is 1, i.e., 1 of the 8 wiper bits. If n=7, then $[(n-1)/2]=[(7-1)/2]=[3]=3$ therefore the number of bits represented by $n_{MED}$ is 3, i.e., $n_{MED}$ is represented by 3 of the 7 wiper bits. The number of bits represented by $n_{LSB}$ is determined by $[n/2]=[3.5]=3$. Accordingly, the number of bits of the wiper address represented by $n_{LSB}$ is 3, i.e., $n_{LSB}$ is represented by 3 of the 7 wiper bits. The number of bits of the wiper address represented by $n_{MSB}$ is 1, i.e., 1 of the 7 wiper bits.

By selecting $n_{MSB}$ to be equal to one, the programmable multistage digital potentiometer can be implemented having a Most Significant Bit (MSB) impedance or low resolution stage, a higher impedance stage coupled between the MSB stage and the higher terminal, and a lower impedance stage coupled between the MSB stage and the lower terminal. A wiper terminal is coupled to the higher and lower impedance stages. The higher impedance stage is comprised of a higher medium range impedance stage (also referred to as a medium resolution stage) and a higher Least Significant Bit (LSB) impedance stage (also referred to as a high resolution stage), where the higher medium range impedance stage provides higher medium range impedance values that are selected by the medium range bits $n_{MED}$ and the higher LSB impedance stage provides higher resolution impedance values for the higher impedance range selected by the LSB bits $n_{LSB}$. The lower stage is comprised of a lower medium range impedance stage (also referred to as a medium resolution stage) and a lower LSB impedance stage (also referred to as a high resolution stage), where the lower medium range impedance stage provides lower medium range impedance values that are selected by the medium range bits $n_{MED}$ and the lower LSB impedance stage provides higher resolution impedance values for the lower impedance range selected by the LSB bits $n_{LSB}$. By way of example, the higher and lower medium impedance stages are symmetrically coupled about the MSB stage and the higher and lower LSB impedance stages are symmetrically coupled about the MSB stage.

FIG. 1 is a schematic diagram of a programmable multistage digital potentiometer 10 in accordance with an embodiment of the present invention. What is shown in FIG. 1 is a control/decoder block 12 coupled to a variable impedance network 14. More particularly, control/decoder block 12 includes an interface circuit 16 coupled for receiving a binary input signal at input terminal 18 from an external source. The external source may be a device external to an integrated circuit containing digital potentiometer 10 or another circuit within the same integrated circuit as digital potentiometer 10. The input signal at terminal 18 may include an n-bit wiper address and/or other data and/or instructions for digital potentiometer 10. Interface circuit 16 may be a serial interface or a parallel interface. Control/decoder block 12 further includes a control logic circuit 20, a wiper address register 22, a non-volatile register 24, and a decoder 26. Control logic circuit 20 is coupled for transmitting and receiving signals to and from interface circuit 16 and coupled for transmitting control signals to wiper address register 22, non-volatile register 24, and decoder 26. In addition to receiving a control signal from control logic circuit 20, wiper address register 22 is coupled for transmitting and receiving data signals to and from interface circuit 16 and non-volatile register 24 and transmitting an address signal to decoder 26. Decoder 26 transmits switch control signals to variable impedance network 14.

Non-volatile register 24 may be an Electrically Erasable Programmable Read Only Memory (EEPROM), flash memory, or the like. Alternatively, non-volatile register 24 may be omitted from programmable multistage digital potentiometer 10. Although register 24 has been described as a non-volatile register, this is not a limitation of the present invention. Register 24 may be a volatile device. By way of example, a non-volatile register 24 stores an initial wiper position value that may be provided to switch logic circuit 20 at system start up for implementation by control logic circuit 20. The initial wiper position may be a last wiper position of digital potentiometer 10 before an immediately prior turn-off of digital potentiometer 10, or may be a universal start-up value, e.g., a lowest wiper position, a highest wiper position, or a middle wiper position. In accordance with embodiments in which register 24 is a volatile device, control logic circuit 20 may be programmed to implement a default wiper position (e.g., a wiper position in the middle of the wiper address range) upon power-on, and then may either increment or decrement the wiper position from the default wiper position, or may jump to a distal (i.e., non-incremental) wiper position from the default position, based on a subsequent input n-bit wiper address.

Variable impedance network 14 has a lower reference voltage terminal 30 and a higher reference voltage terminal 32 and is comprised of a string of impedance stages 40, 42, and 44 where each impedance stage includes one or more impedance elements. Impedance stage 42 has a terminal 42A connected to a terminal 40B of impedance stage 40 and a terminal 42B connected to a terminal 44A of impedance stage 44. Impedance stage 40 has a terminal that serves as lower reference voltage terminal 30 and impedance stage 44 has a terminal that serves as upper reference voltage terminal 32. A common wiper terminal 34 is connected to impedance stages 40 and 44 through wiper switches 46 and 48, respectively.

Impedance stages 40 and 44 operate in response to different bits of an n-bit wiper address, i.e., bits $n_{MED}$ and $n_{LSB}$ as described above and impedance stage 42 has a substantially constant impedance value and its relative position with respect to the common wiper terminal is controlled by a Most Significant (MSB) of the n-bit wiper address. Wiper switches 46 and 48 operate in response to the Most Significant Bit of the n-bit wiper address $n_{MSB}$ and are referred to as MSB switches. Impedance stage 40 is comprised of two sub-stages 50 and 52, where sub-stage 50 may be referred to as a high resolution sub-stage and sub-stage 52 may be referred to as a medium resolution sub-stage. Similarly, impedance stage 44 is comprised of two sub-stages 60 and 62, where sub-stage 60 may be referred to as a high resolution sub-stage and sub-stage 62 may be referred to as a medium resolution sub-stage.

Impedance stage 40 may be referred to as a lower voltage stage and impedance stage 44 may be referred to as a higher voltage stage because they are connected respectively to lower reference voltage terminal 30 and higher reference voltage terminal 32.

It should be understood that high resolution stage 50 operates in response to one or more of the least significant bits of the n-bit wiper address and medium resolution stage 52 operates in response to one or more bits of the n-bit wiper address between the one or more least significant bits and the most significant bit of the n-bit wiper address. Accordingly, high resolution stage 50 may be referred to as a lower voltage Least Significant Bit (LSB) stage and medium resolution stage 52 may be referred to as a lower voltage medium range stage. Likewise, high resolution stage 60 operates in response to one or more of the least significant bits of the n-bit wiper address and medium resolution stage 62 operates in response to one or more bits of the n-bit wiper address that are between the one or more least significant bits and the most significant bit of the n-bit wiper address. Accordingly, high resolution stage 60 may be referred to as a higher voltage LSB stage and medium resolution stage 62 may be referred to as a higher voltage medium range stage.

Alternatively, variable impedance network 14 may be referred to as being comprised of three stages, where MSB stage 42 comprises one stage, lower voltage LSB stage 50 and higher voltage LSB stage 60 form another stage, and lower voltage medium range stage 52 and higher voltage medium range stage 62 form another stage.

Figure 2A:
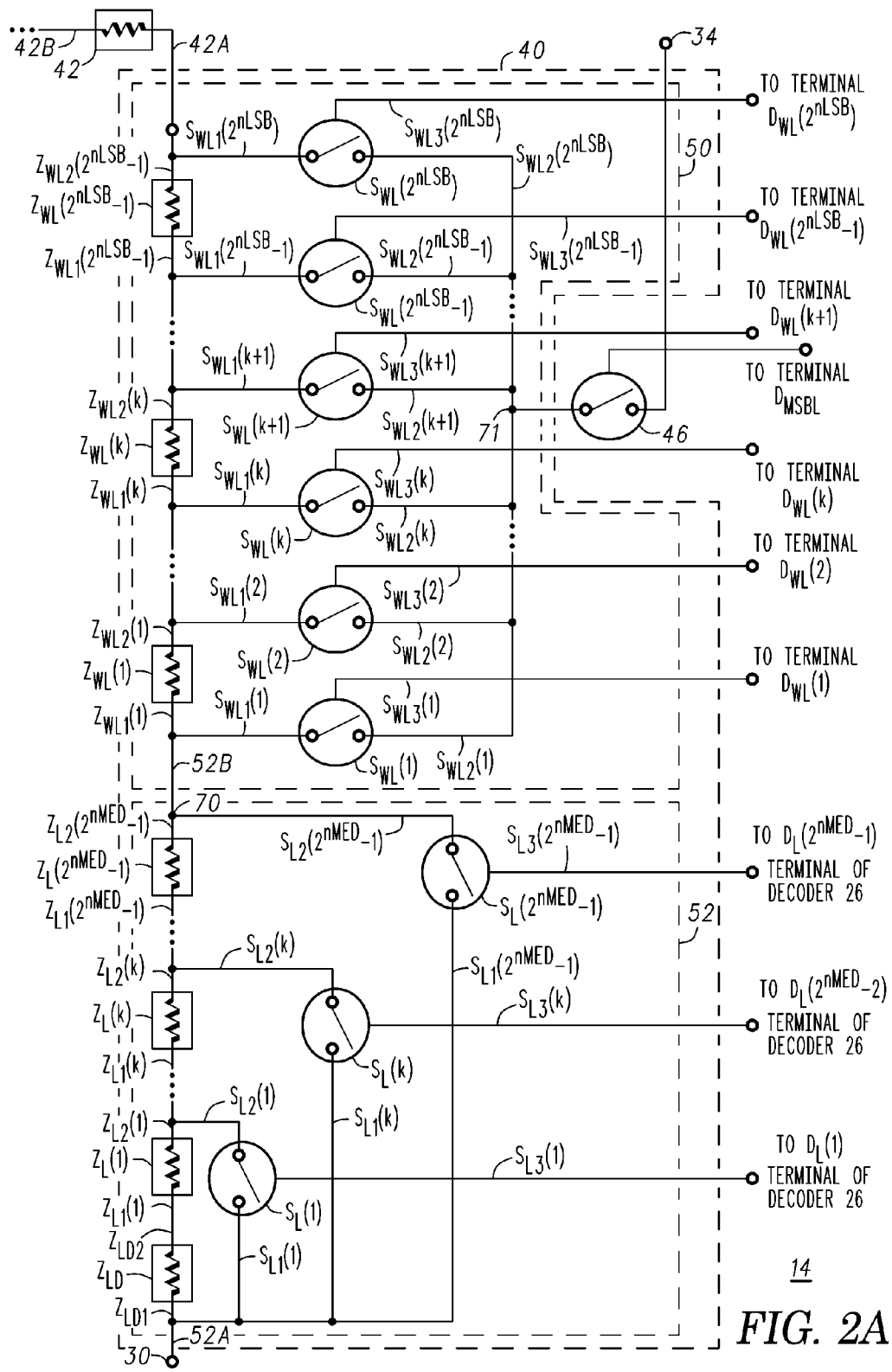
FIGS. 2A-2B are circuit schematics of a portion of the potentiometer of FIG. 1.
Figure 2B:
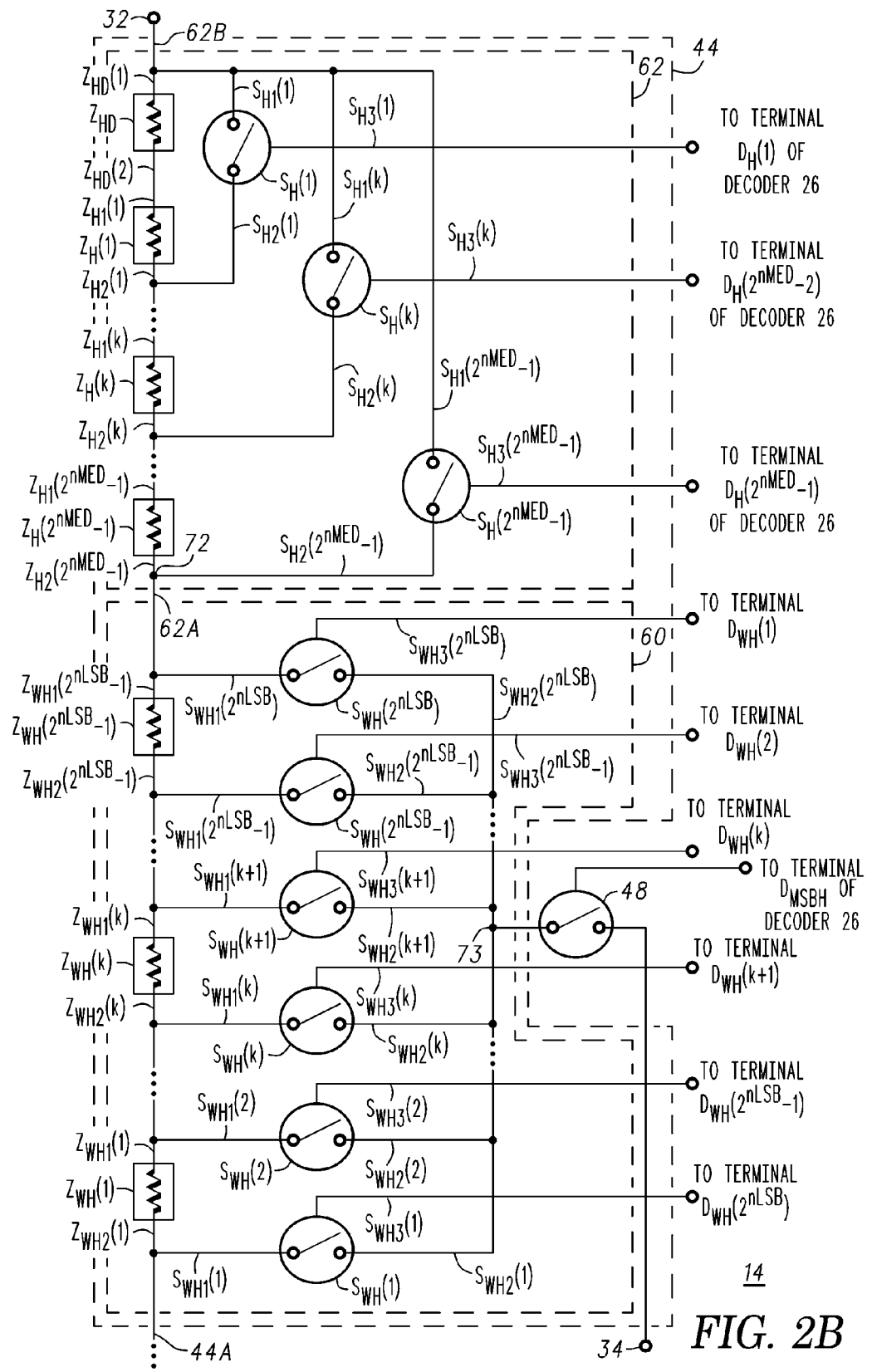
Figure 3A:
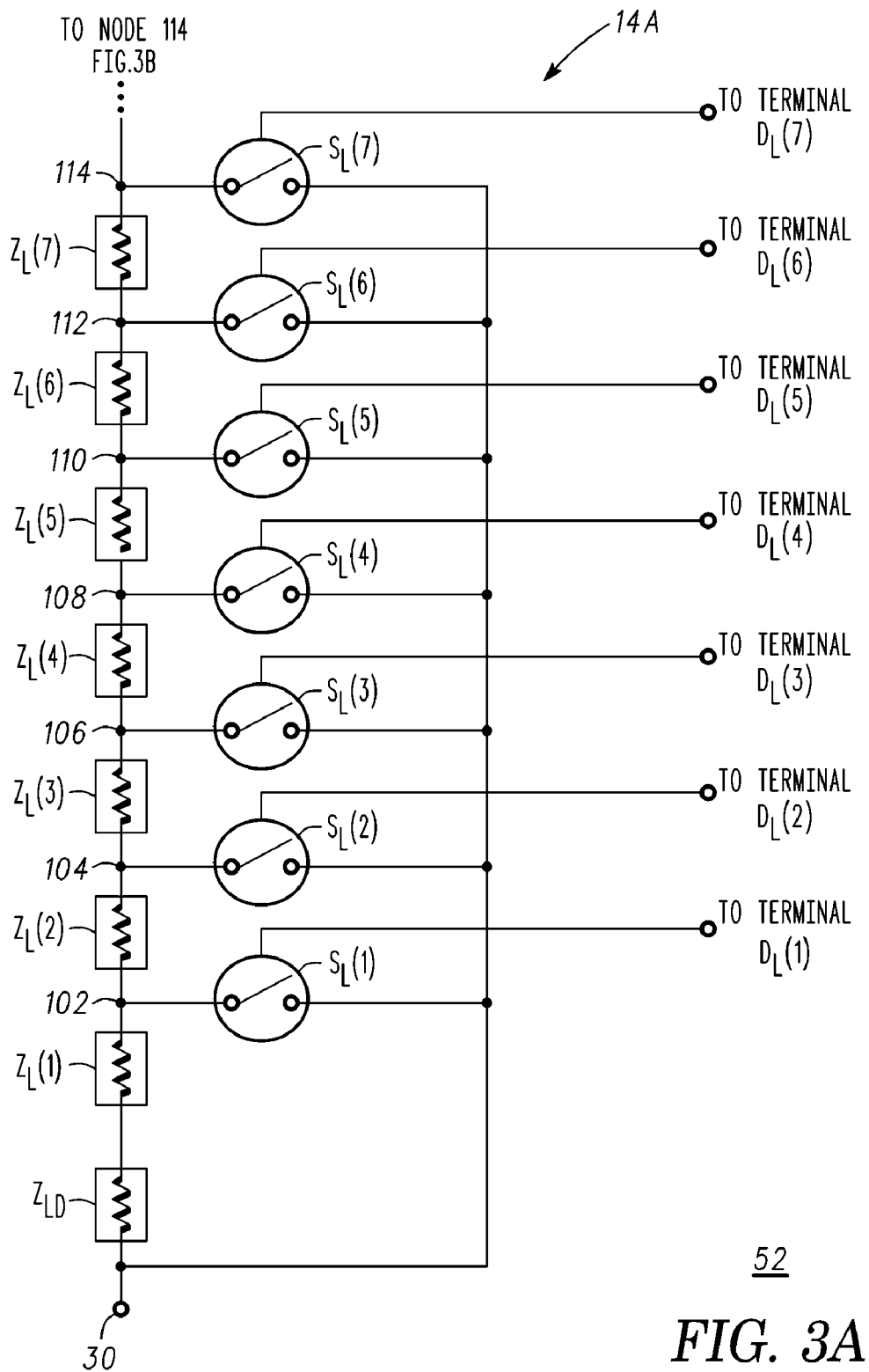
FIGS. 3A-3F are circuit schematics of a portion of a potentiometer having 256 taps in accordance with an embodiment of the present invention.
Figure 3B:
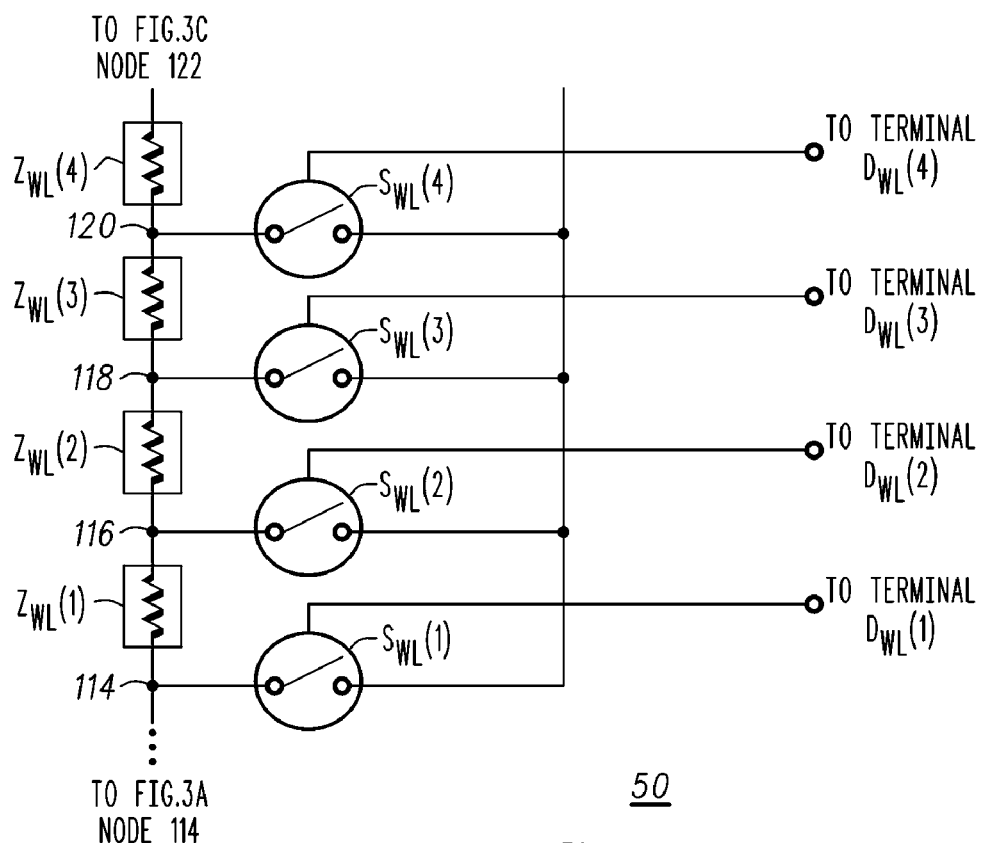
Figure 3C:
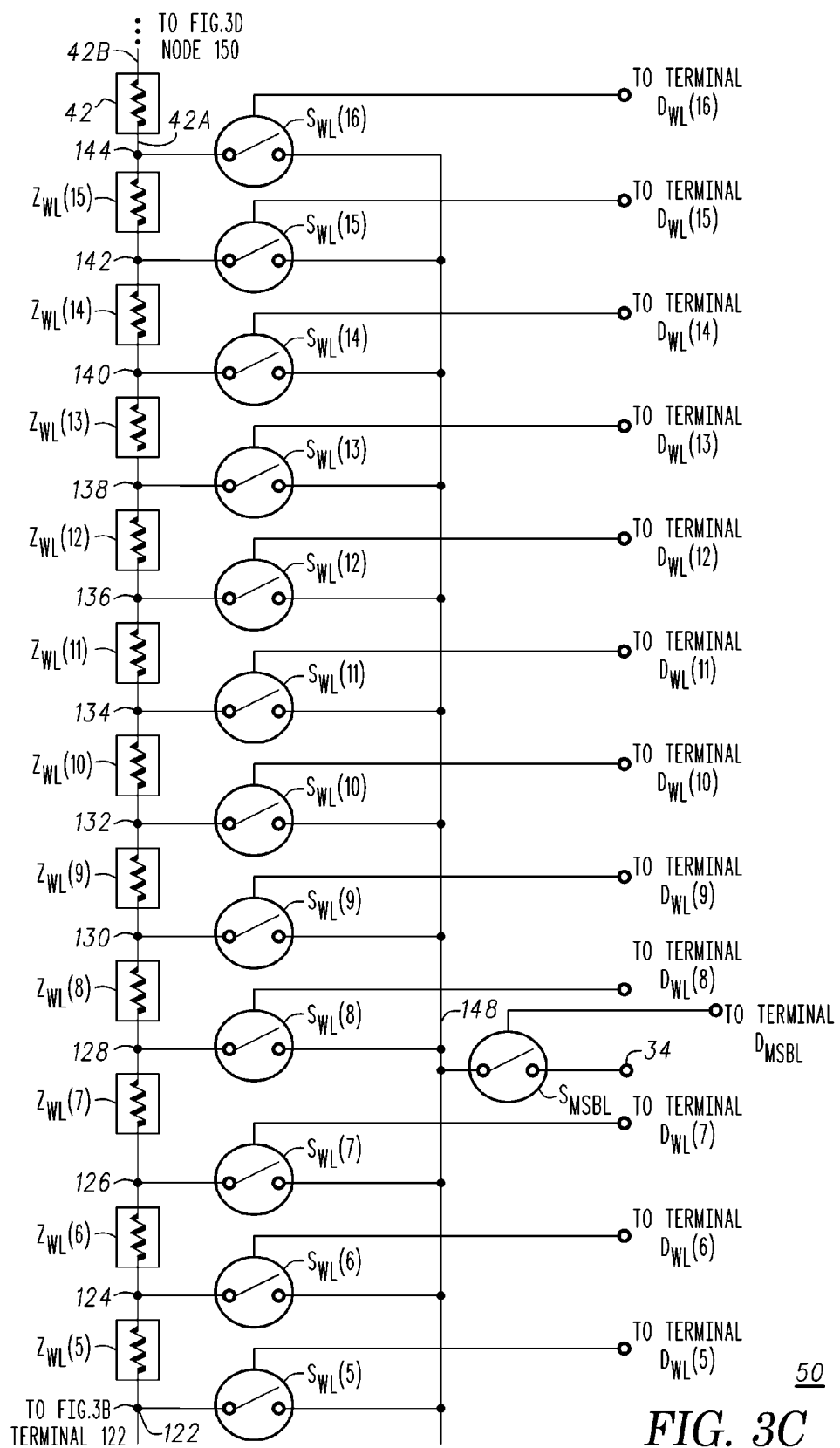
Figure 3D:
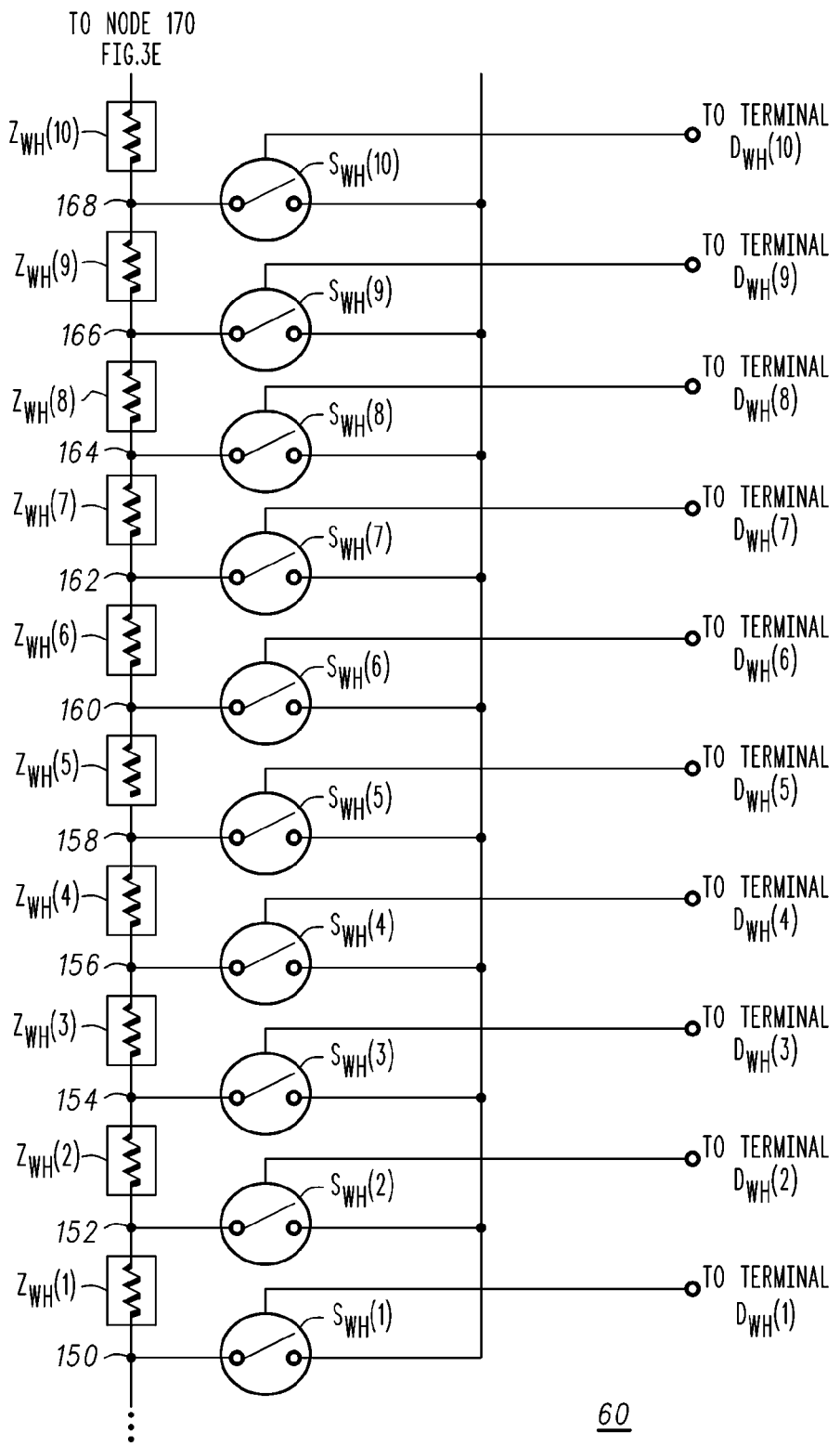
Figure 3E:
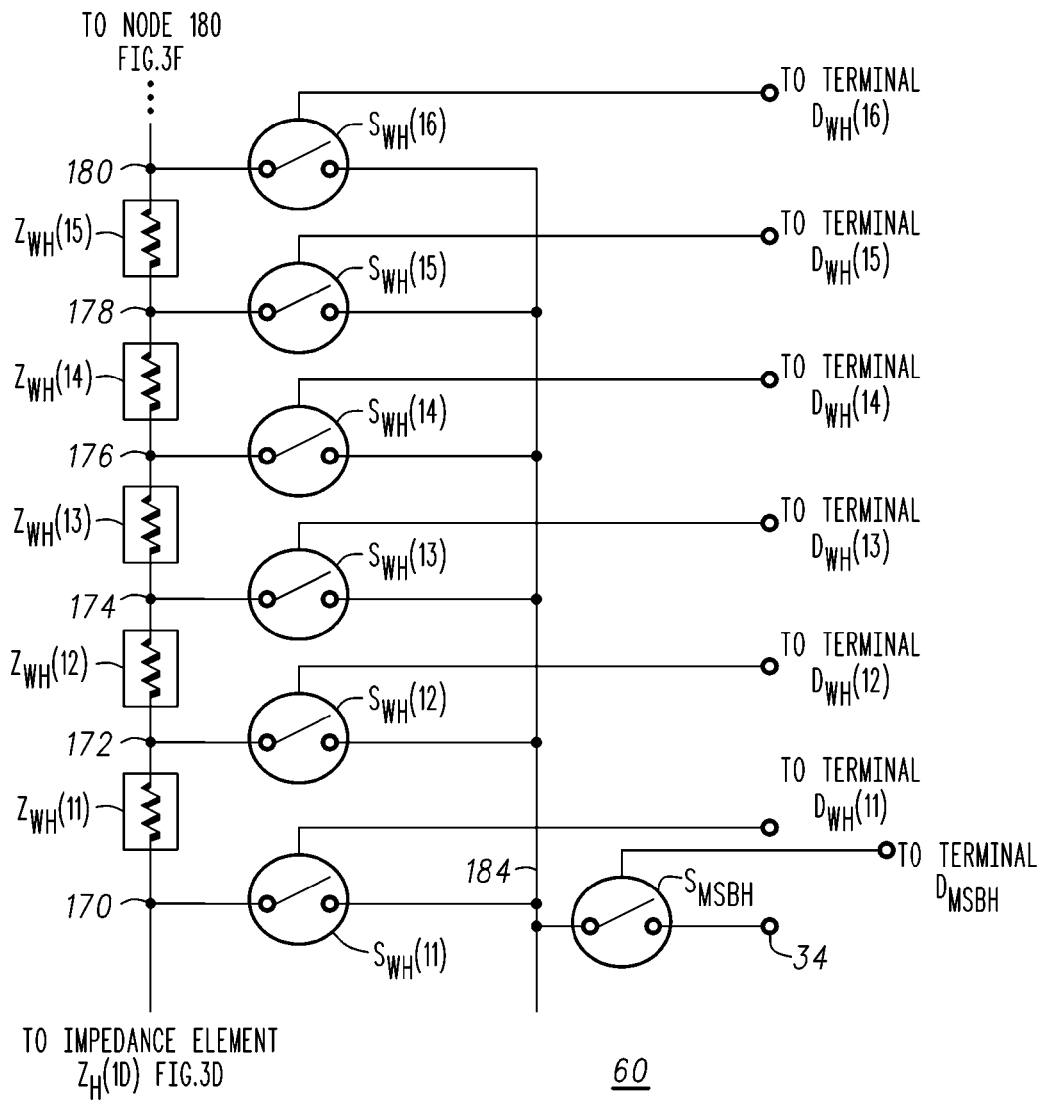
Figure 3F:
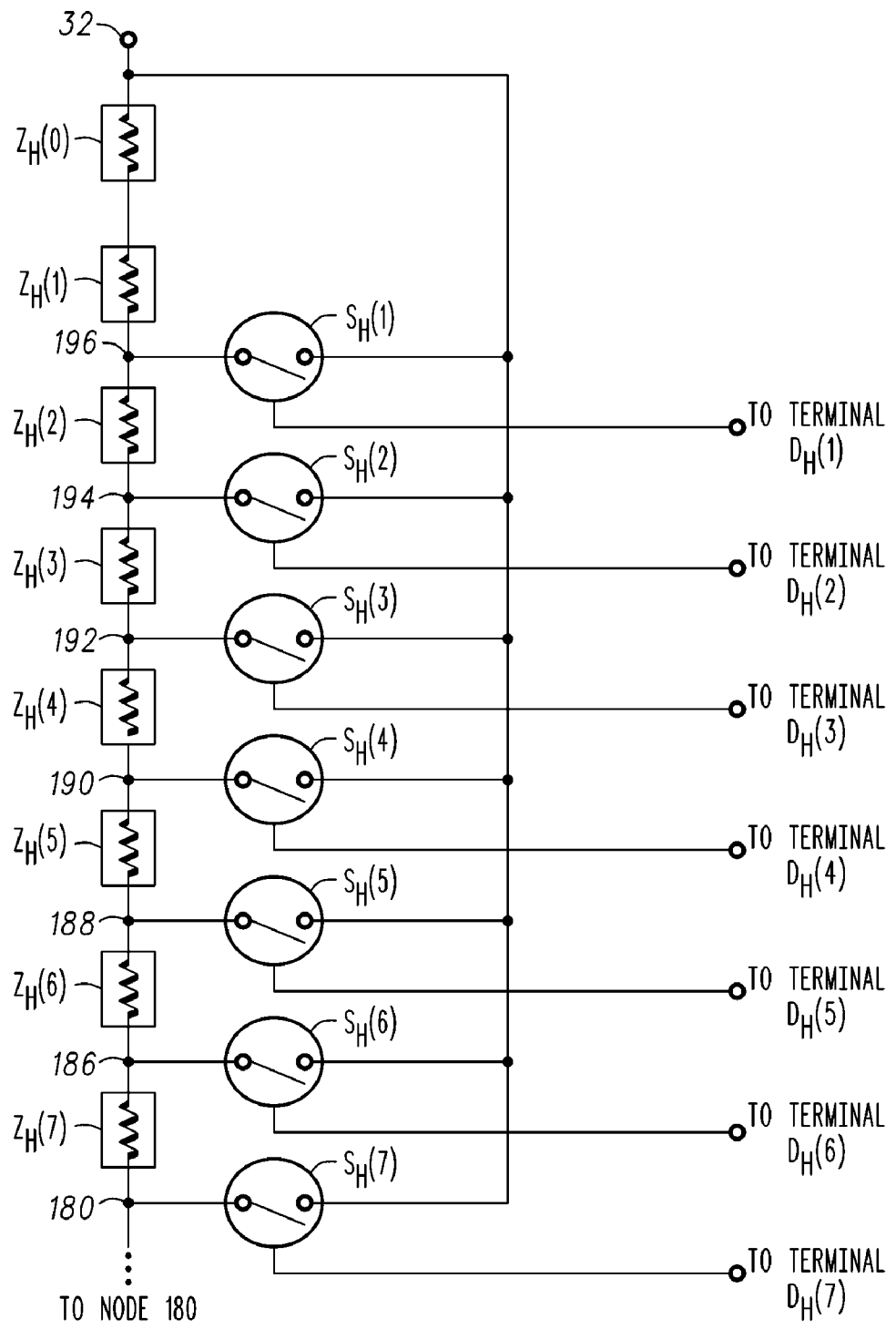

Referring now to FIGS. 2A and 2B, a circuit schematic of variable impedance network 14 is shown. It should be understood that FIG. 2A shows a portion of variable impedance network 14 and FIG. 2B shows another portion of variable impedance network 14. Accordingly, FIGS. 2A and 2B together show an embodiment of variable impedance network 14. FIGS. 1, 2A, and 2B are described together. As discussed above, variable impedance network 14 includes lower voltage impedance stage 40, MSB stage 42, and higher voltage impedance stage 44, where lower voltage impedance stage 40 is comprised of lower voltage impedance LSB structure or stage 50 and lower voltage medium range impedance structure or stage 52 and impedance stage 44 is comprised of higher voltage LSB impedance structure or stage 60 and higher voltage medium range impedance structure or stage 62.

In accordance with an embodiment, lower voltage medium range impedance stage 52 has a lower terminal 52A, an upper terminal 52B, and includes a dummy impedance structure $Z_{LD}$ connected to a string of impedance elements $Z_L(1), \ldots, Z_L(k), \ldots, Z_L(2^{nMED}-1)$ and corresponding switches $S_L(1), \ldots, S_L(k), \ldots, S_L(2^{nMED}-1)$. It should be noted that "k" is an integer in the range 2 to $2^{nMED}-2$ and is used to denote one or more impedance elements $Z_L(k)$ connected in series between impedance elements $Z_L(1)$ and $Z_L(2^{nMED}-1)$ and one or more switches $S_L(k)$ that are coupled to corresponding impedances $Z_L(k)$. Dummy impedance structure $Z_{LD}$ has terminals $Z_{LD1}$ and $Z_{LD2}$; impedance element $Z_L(1)$ has terminals $Z_{L1}(1)$ and $Z_{L2}(1)$; impedance element $Z_L(k)$ has terminals $Z_{L1}(k)$ and $Z_{L2}(k)$; impedance element $Z_L(2^{nMED}-1)$ has terminals $Z_{L1}(2^{nMED}-1)$ and $Z_{L2}(2^{nMED}-1)$; switch $S_L(1)$ has current conducting terminals $S_{L1}(1)$ and $S_{L2}(1)$ and a control terminal $S_{L3}(1)$, switch $S_L(k)$ has terminals $S_{L1}(k)$ and $S_{L2}(k)$ and a control terminal $S_{L3}(k)$; and switch $S_L(2^{nMED}-1)$ has current conducting terminals $S_{L1}(2^{nMED}-1)$ and $S_{L2}(2^{nMED}-1)$ and a control terminal $S_{L3}(2^{nMED}-1)$. Terminal $Z_{LD1}$ of dummy impedance structure $Z_{LD}$ is connected to lower reference voltage terminal 30 and terminal $Z_{LD2}$ is connected to terminal $Z_{L1}(1)$ of impedance element $Z_L(1)$. Terminal $Z_{L2}(1)$ is coupled to terminal $Z_{L1}(k)$, terminal $Z_{L2}(k)$ is coupled to terminal $Z_{L1}(2^{nMED}-1)$, and terminal $Z_{L2}(2^{nMED}-1)$ is the upper end of the impedance string connected to node 70. It should be noted that the terms $Z_L(k)$ and $S_L(k)$ are short hand notations to indicate the presence of one or more impedance elements and one or more switches. For example, for k=2, terminal $Z_{L2}(1)$ may be coupled to terminal $Z_{L1}(2)$ of an impedance element $Z_L(2)$, i.e., an impedance element for which k=2, and for $k=2^{nMED}-1$, terminal $Z_{L2}(2^{nMED}-2)$ of an impedance element $Z_L(2^{nMED}-2)$ may be connected to terminal $Z_{L1}(2^{nMED}-1)$ of impedance element $Z_L(2^{nMED}-1)$, i.e., for an impedance element for which $k=2^{nMED}-2$. Current conducting terminals $S_{L1}(1), \ldots, S_{L1}(k), \ldots, S_{L1}(2^{nMED}-1)$ of switches $S_L(1), \ldots, S_L(k), \ldots, S_L(2^{nMED}-1)$, respectively, are commonly connected to terminal 30. Current conducting terminal $S_{L2}(1)$ of switch $S_L(1)$ is connected to terminal $Z_{L2}(1)$, current conducting terminal $S_{L2}(k)$ is coupled to terminal $Z_{L2}(k)$, and current conducting terminal $S_{L2}(2^{nMED}-1)$ is connected to node 70. It should be noted that in accordance with an embodiment, the number of impedance elements $Z_L$ of impedance stage 52 can range from 1 to $2^{nMED}-1$. Because impedance elements $Z_L(1)$ and $Z_L(2^{nMED}-1)$ are shown in FIG. 2A (and FIG. 5A), the index or variable "k" for impedance structure 52 can range from 2 to $2^{nMED}-2$.

In accordance with an alternative embodiment, lower voltage medium range impedance stage 40 may be comprised of a dummy impedance structure $Z_{LD}$ and a single impedance element $Z_L(1)$.

Dummy impedance structure $Z_{LD}$ is a circuit element connected in series with the chain or string of impedance elements $Z_L(1)$ to $Z_L(2^{nMED}-1)$ that provides a constant equivalent impedance between the current conducting terminals $S_{L1}(m)$ and $S_{L2}(m)$ of any closed switch, i.e., a switch that is on, if all the other switches $S_L(j)$ under it are also closed or shorted. It should be noted that "j" is greater than or equal to 1 and less than or equal to "m." By way of example, the dummy structure is a resistor connected in parallel with a switch that is permanently on or closed. The resistance value of the dummy impedance depends on the value of the equivalent resistance of medium range impedance stage 52 and on the switch series on-resistance, $R_{SH}$. The value of the dummy structure impedance is independent of the number of switches and whether they are shorted or not. The equivalent resistance of medium range impedance stage 52 is:

$$R_{EQV}(m) = (2^{nMED}-1-m)*R_{MED} + R_{SHORT} \qquad \text{EQT. 8}$$

where:

m is the number of shorted switches in medium range impedance stage 52 and may range from zero to $2^{nMED}-1$;

$R_{MED}$ is a medium resistor value; and $R_{SHORT}$ is an impedance having a constant value representing the equivalent impedance between the current conducting terminals $S_{L1}(m)$ and $S_{L2}(m)$ of switch $S_L(m)$ for any "m" in the range 1 to $2^{nMED}-1$ and where $R_{SHORT}$ is in series with resistor $R_{MED}$.

The value of resistor $R_{SHORT}$ is:

$$R_{SHORT} = (R_{MED} + (R_{MED}*(R_{MED}+4*R_{SH}))^{1/2})/2 \qquad \text{EQT. 9}$$

where $R_{SH}$ is the switch series on-resistance.

A switch $S_L(1)$ having current conducting terminals $S_{L1}(1)$ and $S_{L2}(1)$ and a control terminal $S_{L3}(1)$ is connected to impedance element $Z_L(1)$. More particularly, terminal $S_{L1}(1)$ is connected to terminal $Z_{LD1}$ of dummy impedance element $Z_{LD}$, terminal $S_{L2}(1)$ is connected to terminal $Z_{L2}(1)$ of impedance element $Z_L(1)$, and control terminal $S_{L3}(1)$ of switch $S_L(1)$ is connected to terminal $D_L(1)$ of decoder 26. A switch $S_L(k)$ having current conducting terminals $S_{L1}(k)$ and $S_{L2}(k)$ is connected to impedance element $Z_L(k)$. Terminal $S_{L1}(k)$ is connected to lower reference voltage terminal 30 and terminal $S_{L2}(k)$ is connected to terminal $Z_{L2}(k)$ of impedance element $Z_L(k)$. A switch $S_L(2^{nMED}-1)$ having current conducting terminals $S_{L1}(2^{nMED}-1)$ and $S_{L2}(2^{nMED}-1)$ and a control terminal $S_{L3}(2^{nMED}-1)$ is connected to impedance element $Z_L(2^{nMED}-1)$. Terminal $S_{L1}(2^{nMED}-1)$ is connected to lower reference voltage terminal 30 and terminal $S_{L2}(2^{nMED}-1)$ is connected to terminal $Z_{L2}(2^{nMED}-1)$ of impedance element $Z_L(2^{nMED}-1)$. Control terminal $S_{L3}(2^{nMED}-1)$ is connected to terminal $D_L(2^{nMED}-1)$ of decoder 26. Connecting current conducting terminal $S_{L2}(2^{nMED}-1)$ to terminal $Z_{L2}(2^{nMED}-1)$ of impedance element $Z_L(2^{nMED}-1)$ forms a node 70.

Lower voltage LSB stage 50 is comprised of one or more impedance elements $Z_{WL}(1), \ldots, Z_{WL}(k), \ldots, Z_{WL}(2^{nLSB}-1)$ and a plurality of switches $S_{WL}(1), S_{WL}(2), \ldots, S_{WL}(k), S_{WL}(k+1), \ldots, S_{WL}(2^{nLSB}-1), S_{WL}(2^{nLSB})$. Impedance element $Z_{WL}(1)$ has current conducting terminals $Z_{WL1}(1)$ and $Z_{WL2}(1)$, impedance element $Z_{WL}(k)$ has current conducting terminals $Z_{WL1}(k)$ and $Z_{WL2}(k)$, and impedance element $Z_{WL}(2^{nLSB}-1)$ has current conducting terminals $Z_{WL1}(2^{nLSB}-1)$ and $Z_{WL2}(2^{nLSB}-1)$. Switch $S_{WL}(1)$ has current conducting terminals $S_{WL1}(1)$ and $S_{WL2}(1)$ and a control terminal $S_{WL3}(1)$, switch $S_{WL}(2)$ has current conducting terminals $S_{WL1}(2)$ and $S_{WL2}(2)$ and a control terminal $S_{WL3}(2)$, switch $S_{WL}(k)$ has current conducting terminals $S_{WL1}(k)$ and $S_{WL2}(k)$ and a control terminal $S_{WL3}(k)$, switch $S_{WL}(k+1)$ has current conducting terminals $S_{WL1}(k+1)$ and $S_{WL2}(k+1)$ and a control terminal $S_{WL3}(k+1)$, switch $S_{WL}(2^{nLSB}-1)$ has current conducting terminals $S_{WL1}(2^{nLSB}-1)$ and $S_{WL2}(2^{nLSB}-1)$ and a control terminal $S_{WL3}(2^{nLSB}-1)$, and switch $S_{WL}(2^{nLSB})$ has current conducting terminals $S_{WL1}(2^{nLSB})$ and $S_{WL2}(2^{nLSB})$ and a control terminal $S_{WL3}(2^{nLSB})$. Current conducting terminal $Z_{WL1}(1)$ is connected to node 70 and current conducting terminal $Z_{WL2}(1)$ is connected to a current conducting terminal $Z_{WL1}(k)$. Current conducting terminal $Z_{WL1}(k)$ is coupled to current conducting terminal $Z_{WL2}(1)$, current conducting terminal $Z_{WL2}(k)$ is coupled to current conducting terminal $Z_{WL1}(2^{nLSB}-1)$, and current conducting terminal $Z_{WL2}(2^{nLSB}-1)$, which serves as terminal 40B of lower voltage impedance stage 40, is coupled to terminal 42A of MSB stage 42. It should be noted that in accordance with an embodiment, the number of impedance elements $Z_{WL}$ of impedance stage 50 can range from 1 to $2^{nLSB}-1$. Because impedance elements $Z_{WL}(1)$ and $Z_{WL}(2^{nLSB}-1)$ are shown in FIG. 2A (and FIG. 5A), the index or variable "k" for impedance structure 50 can range from 2 to $2^{nLSB}-2$.

Current conducting terminals $S_{WL1}(1)$ and $S_{WL1}(2)$ are connected to terminals $Z_{WL1}(1)$ and $Z_{WL2}(1)$ of impedance element $Z_{WL}(1)$, respectively. Current conducting terminals $S_{WL1}(k)$ and $S_{WL1}(k+1)$ are connected to terminals $Z_{WL1}(k)$ and $Z_{WL2}(k)$ of impedance element $Z_{WL}(k)$, respectively. Current conducting terminals $S_{WL1}(2^{nLSB}-1)$ and $S_{WL1}(2^{nLSB})$ are connected to terminals $Z_{WL1}(2^{nLSB}-1)$ and $Z_{WL2}(2^{nLSB}-1)$ of impedance element $Z_{WL}(2^{nLSB}-1)$, respectively. Connecting terminal $S_{WL1}(2^{nLSB})$ to terminal $Z_{WL2}(2^{nLSB}-1)$ forms a node that serves as terminal 40B (shown in FIG. 1) of lower voltage LSB stage 50. Current conducting terminals $S_{WL2}(1), S_{WL2}(2), \ldots, S_{WL2}(k), S_{WL2}(k+1), \ldots, S_{WL2}(2^{nLSB}-1), S_{WL2}(2^{nLSB}-1)$ are commonly connected together to form a node 71. Control terminals $S_{WL3}(1), S_{WL3}(2), \ldots, S_{WL3}(k), S_{WL3}(k+1), \ldots, S_{WL3}(2^{LSB}-1), S_{WL3}(2^{nLSB})$ are connected to terminals $D_{WL}(1), D_{WL}(2), \ldots, D_{WL}(k), D_{WL}(k+1), \ldots, D_{WL}(2^{nLSB}-1), D_{WL}2^{nLSB}$ of decoder 26, respectively.

It should be noted that in accordance with an alternative embodiment lower voltage LSB stage 50 may be comprised of a single impedance element and two switches such as, for example, impedance element $Z_{WL}(1)$ and switches $S_{WL}(1)$ and $S_{WL}(2)$.

MSB stage 42 is comprised of a bulk impedance having ends that form terminals 42A and 42B. For example, MSB stage 42 is comprised of a bulk resistance of the semiconductor material from which programmable multistage digital potentiometer is fabricated. A switch is absent from MSB stage 42, thus it is referred to as a non-shunted bulk impedance.

Higher voltage LSB stage 60 is comprised of one or more impedance elements $Z_{WH}(1), \ldots, Z_{WH}(k), \ldots, Z_{WH}(2^{nLSB}-1)$ and a plurality of switches $S_{WH}(1), S_{WH}(2), \ldots, S_{WH}(k), S_{WH}(k+1), \ldots, S_{WH}(2^{nLSB}-1), S_{WH}(2^{nLSB})$. Impedance element $Z_{WH}(1)$ has current conducting terminals $Z_{WH1}(1)$ and $Z_{WH2}(1)$, impedance element $Z_{WH}(k)$ has current conducting terminals $Z_{WH1}(k)$ and $Z_{WH2}(k)$, and impedance element $Z_{WH1}(2^{nLSB}-1)$ has current conducting terminals $Z_{WH1}(2^{nLSB}-1)$ and $Z_{WH2}(2^{nLSB}-1)$. Switch $S_{WH}(1)$ has current conducting terminals $S_{WH1}(1)$ and $S_{WH2}(1)$ and a control terminal $S_{WH3}(1)$; switch $S_{WH}(2)$ has current conducting terminals $S_{WH1}(2)$ and $S_{WH2}(2)$ and a control terminal $S_{WH3}(2)$; switch $S_{WH}(k)$ has current conducting terminals $S_{WH1}(k)$ and $S_{WH2}(k)$ and a control terminal $S_{WH3}(k)$; switch $S_{WH}(k+1)$ has current conducting terminals $S_{WH1}(k+1)$ and $S_{WH2}(k+1)$ and a control terminal $S_{WH3}(k+1)$; switch $S_{WH}(2^{nLSB}-1)$ has current conducting terminals $S_{WH1}(2^{nLSB}-1)$ and $S_{WH2}(2^{nLSB}-1)$ and a control terminal $S^{WH3}(2^{nLSB}-1)$, and switch $S_{WH}(2^{nLSB})$ has current conducting terminals $S_{WH1}(2^{nLSB})$ and $S_{WH2}(2^{nLSB})$ and a control terminal $S_{WH3}(2^{nLSB})$. Current conducting terminal $Z_{WH1}(1)$ is connected to terminal 44A (shown in FIG. 1) and current conducting terminal $Z_{WH2}(1)$ is connected to current conducting terminal $Z_{WH1}(k)$. Terminals 44A and 42B are electrically connected together. Current conducting terminal $Z_{WH1}(k)$ is connected to current conducting terminal $Z_{WH2}(1)$ and current conducting terminal $Z_{WH2}(k)$ is connected to current conducting terminal $Z_{WH1}(2^{nLSB}-1)$. It should be noted that in accordance with an embodiment, the number of impedance elements $Z_{WH}$ of impedance stage 62 can range from 1 to $2^{nLSB}-1$. Because impedance elements $Z_{WH}(1)$ and $Z_{WH}(2^{nMED}-1)$ are shown in FIG. 2B (and FIG. 5B), the index or variable "k" for impedance structure 62 can range from 2 to $2^{nLSB}-2$.

Current conducting terminals $S_{WH1}(1)$ and $S_{WH1}(2)$ are connected to terminals $Z_{WH1}(1)$ and $Z_{WH2}(1)$ of impedance element $Z_{WH}(1)$, respectively. Current conducting terminals $S_{WH1}(k)$ and $S_{WH1}(k+1)$ are connected to terminals $Z_{WH1}(k)$ and $Z_{WH2}(k)$ of impedance element $Z_{WH}(k)$, respectively. Current conducting terminals $S_{WH1}(2^{nLSB}-1)$ and $S_{WH1}(2^{nLSB})$ are connected to terminals $Z_{WH1}(2^{nLSB}-1)$ and $Z_{WH2}(2^{nLSB}-1)$ of impedance element $Z_{WH}(2^{nLSB}-1)$, respectively. Connecting terminal $S_{WH1}(2^{nLSB})$ to terminal $Z_{WH2}(2^{nLSB}-1)$ forms a node 72. Current conducting terminals $S_{WH2}(1), S_{WH2}(2), \ldots, S_{WH2}(k), S_{WH2}(k+1), \ldots, S_{WH2}(2^{nLSB}-1), S_{WH2}(2^{nLSB})$ are commonly connected together to form a node 73. Control terminals $S_{WH3}(1), S_{WH3}(2), \ldots, S_{WH3}(k), S_{WH3}(k+1), \ldots, S_{WH3}(2^{nLSB}-1), S_{WH3}(2^{nLSB})$ are connected to terminals $D_{WH}(1), D_{WH}(2, \ldots, D_{WH}(k), D_{WH}(k+1), \ldots, D_{WH}(2^{nLSB}-1), D_{WH}2^{nLSB}$ of decoder 26, respectively.

It should be noted that in an alternative embodiment higher voltage LSB stage 60 may be comprised of a single impedance element and two switches such as, for example, impedance element $Z_{WH}(1)$ and switches $S_{WH}(1)$ and $S_{WH}(2)$.

In accordance with another embodiment, higher voltage medium range impedance stage 62 has a lower terminal 62A, an upper terminal 62B, and includes a dummy impedance structure $Z_{HD}$ connected to a string of impedance elements $Z_H(1), Z_H(k), \ldots, Z_H(2^{nMED}-1)$ and corresponding switches $S_H(1), \ldots, S_H(k), \ldots, S_H(2^{nMED}-1)$, where "k" is an integer in the range 2 to $2^{nMED}-2$. Dummy impedance structure $Z_{HD}$ has terminals $Z_{HD1}$ and $Z_{HD2}$; impedance element $Z_H(1)$ has terminals $Z_{H1}(1)$ and $Z_{H2}(1)$; impedance element $Z_H(k)$ has terminals $Z_{H1}(k)$ and $Z_{H2}(k)$; impedance element $Z_H(2^{nMED}-1)$ has terminals $Z_{H1}(2^{nMED}-1)$ and $Z_{H2}(2^{nMED}-1)$; switch $S_H(1)$ has current conducting terminals $S_{H1}(1)$ and $S_{H2}(1)$ and a control terminal $S_{H3}(1)$, switch $S_H(k)$ has terminals $S_{H1}(k)$ and $S_{H2}(k)$ and a control terminal $S_{H3}(k)$; and switch $S_H(2^{nMED}-1)$ has current conducting terminals $S_{H1}(2^{nMED}-1)$ and $S_{H2}(2^{nMED}-1)$ and a control terminal $S_{H3}(2^{nMED}-1)$. Terminal $Z_{HD1}$ of dummy impedance structure $Z_{HD}$ is connected to upper reference voltage terminal 32 and terminal $Z_{HD2}$ is connected to terminal $Z_{H1}(1)$ of impedance element $Z_H(1)$. Terminal $Z_{H2}(1)$ is connected to terminal $Z_{H1}(k)$, terminal $Z_{H2}(k)$ is connected to terminal $Z_{H1}(2^{nMED}-1)$, and terminal $Z_{H2}(2^{nMED}-1)$ is the lower end of the impedance string connected to node 72. Current conducting terminals $S_{H1}(1), \ldots, S_{H1}(k), \ldots, S_{H1}(2^{nMED}-1)$ of switches $S_H(1), \ldots, S_H(k), \ldots, S_{LH}(2^{nMED}-1)$, respectively, are commonly connected to reference terminal 32. Current conducting terminal $S_{H2}(1)$ of switch $S_H(1)$ is connected to terminal $Z_{H2}(1)$, current conducting terminal $S_{H2}(k)$ is connected to terminal $Z_{H2}(k)$, and current conducting terminal $S_{H2}(2^{nMED}-1)$ is connected to node 72. It should be noted that in accordance with an embodiment, the number of impedance elements $Z_H$ of impedance stage 62 can range from 1 to $2^{nMED}-1$. Because impedance elements $Z_H(1)$ and $Z_H(2^{nMED}-1)$ are shown in FIG. 2B (and FIG. 5B), the index or variable "k" for impedance structure 62 can range from 2 to $2^{nMED}-2$.

In accordance with an alternative embodiment, higher voltage medium range impedance stage 62 may be comprised of a dummy impedance structure $Z_{HD}$ and a single impedance element $Z_H(1)$.

Dummy impedance structure $Z_{HD}$ is a circuit element connected in series with the chain or string of impedance elements $Z_H(1)$ to $Z_H(2^{nMED}-1)$ that provides a constant equivalent impedance between the current conducting terminals $S_{H1}(m)$ and $S_{H2}(m)$ of any closed switch, i.e., a switch that is on, if all the other switches $S_H(j)$ under it are also closed or shorted. It should be noted that "j" is greater than or equal to 1 and less than or equal to "m." By way of example, the dummy structure is a resistor connected in parallel with a switch that is permanently on or closed. The resistance value of the dummy impedance depends on the value of the equivalent resistance of medium range impedance stage 62 and on the switch series on-resistance, $R_{SH}$. The value of the dummy structure impedance is independent of the number of switches and whether they are shorted or not. The equivalent resistance of medium range impedance stage 62 is:

$$R_{EQV}(m)=(2^{nMED}-1-m)*R_{MED}+R_{SHORT} \qquad \text{EQT. 10}$$

where:

m is the number of shorted switches in medium range impedance stage 62 and may range from zero to $2^{nMED}$;

$R_{MED}$ is a medium resistor value; and $R_{SHORT}$ is a constant resistor representing the equivalent impedance between the current conducting terminals $S_{H1}(m)$ and $S_{H2}(m)$ of switch $S_H(m)$ for any "m" in the range 1 to $2^{nMED}-1$ and where $R_{SHORT}$ is in series with resistor $R_{MED}$.

The value of resistor $R_{SHORT}(m)$ is:

$$R_{SHORT}=(R_{MED}+(R_{MED}*(R_{MED}+4*R_{SH}))^{1/2})/2 \qquad \text{EQT. 11}$$

where $R_{SH}$ is the switch series on-resistance.

A switch $S_H(1)$ having current conducting terminals $S_{H1}(1)$ and $S_{H2}(1)$ and a control terminal $S_{H3}(1)$ is connected to impedance element $Z_H(1)$. More particularly, terminal $S_{H1}(1)$ is connected to terminal $Z_{HD}(1)$ of dummy impedance element $Z_{HD}$, terminal $S_{H2}(1)$ is connected to terminal $Z_{H2}(1)$ of impedance element $Z_H(1)$, and control terminal $S_{H3}(1)$ of switch $S_H(1)$ is connected to terminal $D_H(1)$ of decoder 26. Generally, a switch $S_H(k)$ having current conducting terminals $S_{H1}(k)$ and $S_{H2}(k)$ is connected to impedance element $Z_H(k)$. In particular, terminal $S_{H1}(k)$ is connected to higher reference voltage terminal 32 and terminal $S_{H2}(k)$ is connected to terminal $Z_{H2}(k)$ of impedance element $Z_H(k)$. A switch $S_H(2^{nMED}-1)$ having current conducting terminals $S_{H1}(2^{nMED}-1)$ and $S_{H2}(2^{nMED}-1)$ and a control terminal $S_{H3}(2^{nMED}-1)$ is connected to impedance element $Z_H(2^{nMED}-1)$. In particular, terminal $S_{H1}(2^{nMED}-1)$ is connected to higher reference voltage terminal 32 and terminal $S_{H2}(2^{nMED}-1)$ is connected to terminal $Z_{H2}(2^{nMED}-1)$ of impedance element $Z_H(2^{nMED}-1)$. Control terminal $S_{H3}(2^{nMED}-1)$ is connected to terminal $D_H(2^{nMED}-1)$ of decoder 26. Connecting current conducting terminal $S_{H2}(2^{nMED}-1)$ to terminal $Z_{H2}(2^{nMED}-1)$ of impedance element $Z_H(2^{nMED}-1)$ forms a node 72.

It should be noted that in an alternative embodiment higher voltage LSB stage 60 may be comprised of a single impedance element and two switches such as, for example, impedance element $Z_{WH}(1)$ and switches $S_{WH}(1)$ and $S_{WH}(2)$.

Still referring to FIGS. 2A and 2B, switch 46 has a current conducting terminal connected to node 71 and switch 48 has a current conducting terminal connected to node 73. Nodes 73 and 71 are also referred to as upper and lower wiper terminals, respectively. The other current conducting terminals of switches 46 and 48 are commonly connected together to form a common wiper terminal 34. The control terminal of switch 46 is connected to terminal $D_{MSBL}$ of decoder 26 and the control terminal of switch 48 is connected to terminal $D_{MSBH}$ of decoder 26.

For the sake of clarity, the operation will be described for a programmable digital potentiometer having 256 taps. However, it should be understood that the description applies to an n-bit decoder signal where the number of bits, i.e., the value of "n" may be less than or greater than eight. To aid in the description, FIGS. 3A, 3B, 3C, 3D, 3E, and 3F illustrate a variable impedance network 14A configured to have 256 taps and which receives a 32-bit decoded signal from an 8-bit decoder 26. Reference character "A" has been appended to reference character "14" to distinguish a digital programmable potentiometer having 256 taps from one having more or fewer than 256 taps. Variable impedance network 14A includes lower voltage impedance stage 40, MSB stage 42, and higher voltage impedance stage 44. As discussed above, lower voltage impedance stage 40 is comprised of lower voltage LSB stage 50 and lower voltage medium range stage 52 and impedance stage 44 is comprised of higher voltage LSB stage 60 and higher voltage medium range stage 62. Lower voltage medium range stage 52 includes a string of impedance elements $Z_L(1), Z_L(2), Z_L(3), Z_L(4), Z_L(5), Z_L(6)$, and $Z_L(7)$ that are connected in a series configuration, i.e., a terminal of impedance element $Z_L(1)$ is connected to lower reference terminal 30 through a dummy structure $Z_{LD}$ and an opposing terminal of impedance element $Z_L(1)$ is connected to a terminal of impedance element $Z_L(2)$ to form a node 102. An opposing terminal of impedance element $Z_L(2)$ is connected to a terminal of impedance element $Z_L(3)$ to form a node 104 and an opposing terminal of impedance element $Z_L(3)$ is connected to a terminal of impedance element $Z_L(4)$ to form a node 106. An opposing terminal of impedance element $Z_L(4)$ is connected to a terminal of impedance element $Z_L(5)$ to form a node 108 and an opposing terminal of impedance element $Z_L(5)$ is connected to a terminal of impedance element $Z_L(6)$ to form a node 110. An opposing terminal of impedance element $Z_L(6)$ is connected to a terminal of impedance element $Z_L(7)$ to form a node 112 and an opposing terminal of impedance element $Z_L(7)$ is connected to a terminal of impedance element $Z_{WL}(1)$ to form a node 114.

Lower voltage medium stage 52 further includes switches $S_L(1)$ to $S_L(7)$ connected to the string of impedance elements $Z_L(1)$ to $Z_L(7)$. More particularly, switch $S_L(1)$ has a terminal connected to node 102, a terminal connected to terminal 30, and a control terminal coupled for receiving a control signal via terminal $D_L(1)$; switch $S_L(2)$ has a terminal connected to node 104, a terminal connected to terminal 30, and a control terminal coupled for receiving a control signal via terminal $D_L(2)$; switch $S_L(3)$ has a terminal connected to node 106, a terminal connected to terminal 30, and a control terminal coupled for receiving a control signal via terminal $D_L(3)$; switch $S_L(4)$ has a terminal connected to node 108, a terminal connected to terminal 30, and a control terminal coupled for receiving a control signal via terminal $D_L(4)$; switch $S_L(5)$ has a terminal connected to node 110, a terminal connected to terminal 30, and a control terminal coupled for receiving a control signal via terminal $D_L(5)$; switch $S_L(6)$ has a terminal connected to node 112, a terminal connected to terminal 30, and a control terminal coupled for receiving a control signal via terminal $D_L(6)$; and switch $S_L(7)$ has a terminal connected to node 114, a terminal connected to terminal 30, and a control terminal coupled for receiving a control signal via terminal $D_L(7)$.

Lower voltage LSB stage 50 includes a string of impedance elements $Z_{WL}(1)$ to $Z_{WL}(15)$ that are coupled in a series configuration, i.e., a terminal of impedance element $Z_{WL}(1)$ is connected to node 114 and an opposing terminal of impedance element $Z_{WL}(1)$ is connected to a terminal of impedance element $Z_{WL}(2)$ to form a node 116. An opposing terminal of impedance element $Z_{WL}(2)$ is connected to a terminal of impedance element $Z_{WL}(3)$ to form a node 118 and an opposing terminal of impedance element $Z_{WL}(3)$ is connected to a terminal of impedance element $Z_{WL}(4)$ to form a node 120. An opposing terminal of impedance element $Z_{WL}(4)$ is connected to a terminal of impedance element $Z_{WL}(5)$ to form a node 122 and an opposing terminal of impedance element $Z_{WL}(5)$ is connected to a terminal of impedance element $Z_{WL}(6)$ to form a node 124. An opposing terminal of impedance element $Z_{WL}(6)$ is connected to a terminal of impedance element $Z_{WL}(7)$ to form a node 126 and an opposing terminal of impedance element $Z_{WL}(7)$ is connected to a terminal of impedance element $Z_{WL}(8)$ to form a node 128. An opposing terminal of impedance element $Z_{WL}(8)$ is connected to a terminal of impedance element $Z_{WL}(9)$ to form a node 130 and an opposing terminal of impedance element $Z_{WL}(9)$ is connected to a terminal of impedance element $Z_{WL}(10)$ to form a node 132. An opposing terminal of impedance element $Z_{WL}(10)$ is connected to a terminal of impedance element $Z_{WL}(11)$ to form a node 134 and an opposing terminal of impedance element $Z_{WL}(11)$ is connected to a terminal of impedance element $Z_{WL}(12)$ to form a node 136. An opposing terminal of impedance element $Z_{WL}(12)$ is connected to a terminal of impedance element $Z_{WL}(13)$ to form a node 138 and an opposing terminal of impedance element $Z_{WL}(13)$ is connected to a terminal of impedance element $Z_{WL}(14)$ to form a node 140. An opposing terminal of impedance element $Z_{WL}(14)$ is connected to a terminal of impedance element $Z_{WL}(15)$ to form a node 142. An opposing terminal of impedance element $Z_{WL}(15)$ is connected to terminal 42A of MSB stage 42. Terminal 42B of MSB stage 42 is connected to an impedance element $Z_H(1)$ (shown in FIG. 3D).

Lower voltage LSB stage 50 further includes switches $S_{WL}(1)$ to $S_{WL}(17)$ connected to the string of impedance elements $Z_{WL}(1)$ to $Z_{WL}(16)$. More particularly, switch $S_{WL}(1)$ has a terminal connected to node 114, a terminal connected to switch $S_{MSBL}$ to form a node 148, and a control terminal coupled for receiving a control signal via terminal $D_{WL}(1)$; switch $S_{WL}(2)$ has a terminal connected to node 116, a terminal connected to node 148, and a control terminal coupled for receiving a control signal via terminal $D_{WL}(2)$; switch $S_{WL}(3)$ has a terminal connected to node 118, a terminal connected to node 148, and a control terminal coupled for receiving a control signal via terminal $D_{WL}(3)$; switch $S_{WL}(4)$ has a terminal connected to node 120, a terminal connected to node 148, and a control terminal coupled for receiving a control signal via terminal $D_{WL}(4)$; switch $S_{WL}(5)$ has a terminal connected to node 122, a terminal connected to node 148, and a control terminal coupled for receiving a control signal via terminal $D_{WL}(5)$; switch $S_{WL}(6)$ has a terminal connected to node 124, a terminal connected to node 148, and a control terminal coupled for receiving a control signal via terminal $D_{WL}(6)$; switch $S_{WL}(7)$ has a terminal connected to node 126, a terminal connected to node 148, and a control terminal coupled for receiving a control signal via terminal $D_{WL}(7)$; switch $S_{WL}(8)$ has a terminal connected to node 128, a terminal connected to node 148, and a control terminal coupled for receiving a control signal via terminal $D_{WL}(8)$; switch $S_{WL}(9)$ has a terminal connected to node 130, a terminal connected to node 148, and a control terminal coupled for receiving a control signal via terminal $D_{WL}(9)$; switch $S_{WL}(10)$ has a terminal connected to node 132, a terminal connected to node 148, and a control terminal coupled for receiving a control signal via terminal $D_{WL}(10)$; switch $S_{WL}(11)$ has a terminal connected to node 134, a terminal connected to node 148, and a control terminal coupled for receiving a control signal via terminal $D_{WL}(11)$; switch $S_{WL}(12)$ has a terminal connected to node 136, a terminal connected to node 148, and a control terminal coupled for receiving a control signal via terminal $D_{WL}(12)$; switch $S_{WL}(13)$ has a terminal connected to node 138, a terminal connected to node 148, and a control terminal coupled for receiving a control signal via terminal $D_{WL}(13)$; switch $S_{WL}(14)$ has a terminal connected to node 140, a terminal connected to node 148, and a control terminal coupled for receiving a control signal via terminal $D_{WL}(14)$; switch $S_{WL}(15)$ has a terminal connected to node 142, a terminal connected to node 148, and a control terminal coupled for receiving a control signal via terminal $D_{WL}(15)$; and switch $S_{WL}(16)$ has a terminal connected to node 144, a terminal connected to node 148, and a control terminal coupled for receiving a control signal via terminal $D_{WL}(16)$. Switch $S_{MSBL}$ has a terminal connected to common wiper terminal 34 and a control terminal coupled for receiving a control signal via terminal $D_{MSBL}$.

Higher voltage LSB stage 60 includes a string of impedance elements $Z_{WH}(1)$ to $Z_{WH}(16)$ that are coupled in a series configuration, i.e., a terminal of impedance element $Z_{WH}(1)$ is connected to node 150 and an opposing terminal of impedance element $Z_{WH}(1)$ is connected to a terminal of impedance element $Z_{WH}(2)$ to form a node 152. An opposing terminal of impedance element $Z_{WH}(2)$ is connected to a terminal of impedance element $Z_{WH}(3)$ to form a node 154 and an opposing terminal of impedance element $Z_{WH}(3)$ is connected to a terminal of impedance element $Z_{WH}(4)$ to form a node 156. An opposing terminal of impedance element $Z_{WH}(4)$ is connected to a terminal of impedance element $Z_{WH}(5)$ to form a node 158 and an opposing terminal of impedance element $Z_{WH}(5)$ is connected to a terminal of impedance element $Z_{WH}(6)$ to form a node 160. An opposing terminal of impedance element $Z_{WH}(6)$ is connected to a terminal of impedance element $Z_{WH}(7)$ to form a node 162 and an opposing terminal of impedance element $Z_{WH}(7)$ is connected to a terminal of impedance element $Z_{WH}(8)$ to form a node 164. An opposing terminal of impedance element $Z_{WH}(8)$ is connected to a terminal of impedance element $Z_{WH}(9)$ to form a node 166 and an opposing terminal of impedance element $Z_{WH}(9)$ is connected to a terminal of impedance element $Z_{WH}(10)$ to form a node 168. An opposing terminal of impedance element $Z_{WH}(10)$ is connected to a terminal of impedance element $Z_{WH}(11)$ to form a node 170 and an opposing terminal of impedance element $Z_{WH}(11)$ is connected to a terminal of impedance element $Z_{WH}(12)$ to form a node 172. An opposing terminal of impedance element $Z_{WH}(12)$ is connected to a terminal of impedance element $Z_{WH}(13)$ to form a node 174 and an opposing terminal of impedance element $Z_{WH}(13)$ is connected to a terminal of impedance element $Z_{WH}(14)$ to form a node 176. An opposing terminal of impedance element $Z_{WH}(14)$ is connected to a terminal of impedance element $Z_{WH}(15)$ to form a node 178. An opposing terminal of impedance element $Z_{WH}(15)$ (shown in FIG. 3D) is connected to a terminal of impedance element $Z_H(7)$ to form a node 180.

Higher voltage LSB stage 60 further includes switches $S_{WH}(1)$ to $S_{WH}(16)$ connected to the string of impedance elements $Z_{WH}(1)$ to $Z_{WH}(16)$. More particularly, switch $S_{WH}(1)$ has a terminal connected to node 150, an opposing terminal connected to a terminal of a switch $S_{MSBH}$ to form a node 184, and a control terminal coupled for receiving a control signal via terminal $D_{WH}(1)$; switch $S_{WH}(2)$ has a terminal connected to node 152, a terminal connected to node 184, and a control terminal coupled for receiving a control signal via terminal $D_{WH}(2)$; switch $S_H(3)$ has a terminal connected to node 154, a terminal connected to node 184, and a control terminal coupled for receiving a control signal via terminal $D_{WH}(3)$; switch $S_{WH}(4)$ has a terminal connected to node 156, a terminal connected to node 184, and a control terminal coupled for receiving a control signal via terminal $D_{WH}(4)$; switch $S_{WH}(5)$ has a terminal connected to node 158, a terminal connected to node 184, and a control terminal coupled for receiving a control signal via terminal $D_{WH}(5)$; switch $S_{WH}(6)$ has a terminal connected to node 160, a terminal connected to node 184, and a control terminal coupled for receiving a control signal via terminal $D_{WH}(6)$; switch $S_{WH}(7)$ has a terminal connected to node 162, a terminal connected to node 184, and a control terminal coupled for receiving a control signal via terminal $D_{WH}(7)$; switch $S_{WH}(8)$ has a terminal connected to node 164, a terminal connected to node 184, and a control terminal coupled for receiving a control signal via terminal $D_{WH}(8)$; switch $S_{WH}(9)$ has a terminal connected to node 166, a terminal connected to node 184, and a control terminal coupled for receiving a control signal via terminal $D_{WH}(9)$; switch $S_{WH}(10)$ has a terminal connected to node 168, a terminal connected to node 184, and a control terminal coupled for receiving a control signal via terminal $D_{WH}(10)$; switch $S_{WH}(11)$ has a terminal connected to node 170, a terminal connected to node 184, and a control terminal coupled for receiving a control signal via terminal $D_{WH}(11)$; switch $S_{WH}(12)$ has a terminal connected to node 172, a terminal connected to node 184, and a control terminal coupled for receiving a control signal via terminal $D_{WH}(12)$; switch $S_{WH}(13)$ has a terminal connected to node 174, a terminal connected to node 184, and a control terminal coupled for receiving a control signal via terminal $D_{WH}(13)$; switch $S_{WH}(14)$ has a terminal connected to node 176, a terminal connected to node 184, and a control terminal coupled for receiving a control signal via terminal $D_{WH}(14)$; switch $S_{WH}(15)$ has a terminal connected to node 178, a terminal connected to node 184, and a control terminal coupled for receiving a control signal via terminal $D_{WH}(15)$; switch $S_{WH}(16)$ has a terminal connected to node 180, a terminal connected to node 184, and a control terminal coupled for receiving a control signal via terminal $D_{WH}(16)$. Switch $S_{MSBH}$ has a terminal connected to terminal 32 and a control terminal coupled for receiving a control signal via terminal $D_{MSBH}$.

Upper voltage medium range stage 62 includes a string of impedance elements $Z_H(1)$ to $Z_H(7)$ that are coupled in a series configuration, i.e., a terminal of impedance element $Z_H(1)$ is coupled to upper reference terminal 32 through a dummy structure $Z_H(D)$ and an opposing terminal of impedance element $Z_H(1)$ is connected to a terminal of impedance element $Z_H(2)$ to form a node 196. An opposing terminal of impedance element $Z_H(2)$ is connected to a terminal of impedance element $Z_H(3)$ to form a node 194 and an opposing terminal of impedance element $Z_H(3)$ is connected to a terminal of impedance element $Z_H(4)$ to form a node 192. An opposing terminal of impedance element $Z_H(4)$ is connected to a terminal of impedance element $Z_H(5)$ to form a node 190 and an opposing terminal of impedance element $Z_H(5)$ is connected to a terminal of impedance element $Z_H(6)$ to form a node 188. An opposing terminal of impedance element $Z_H(6)$ is connected to a terminal of impedance element $Z_H(7)$ to form a node 186 and an opposing terminal of impedance element $Z_H(7)$ is connected to node 182.

Higher voltage medium stage 62 further includes switches $S_H(1)$ to $S_H(7)$ connected to the string of impedance elements $Z_H(1)$ to $Z_H(7)$. More particularly, switch $S_H(1)$ has a terminal connected to node 196, a terminal connected to terminal 32, and a control terminal coupled for receiving a control signal via terminal $D_H(1)$; switch $S_H(2)$ has a terminal connected to node 194, a terminal connected to terminal 32, and a control terminal coupled for receiving a control signal via terminal $D_H(2)$; switch $S_H(3)$ has a terminal connected to node 192, a terminal connected to Higher voltage medium stage 62 further includes switches $S_H(1)$ to $S_H(7)$ connected to the string of impedance elements $Z_H(1)$ to $Z_H(7)$. More terminal 32, and a control terminal coupled for receiving a control signal via terminal D(3); switch $S_H(4)$ has a terminal connected to node 190, a terminal connected to terminal 32, and a control terminal coupled for receiving a control signal via terminal $D_H(4)$; switch $S_H(5)$ has a terminal connected to node 188, a terminal connected to terminal 32, and a control terminal coupled for receiving a control signal via terminal $D_H(5)$; switch $S_H(6)$ has a terminal connected to node 186, a terminal connected to terminal 32, and a control terminal coupled for receiving a control signal via terminal $D_H(6)$; and switch $S_H(7)$ has a terminal connected to node 182, a terminal connected to terminal 32, and a control terminal coupled for receiving a control signal via terminal $D_H(7)$.

In operation and as described above, control/decoder block 12 receives an input signal at input terminal 18 and extracts an n-bit signal or wiper address that is indicative of a desired impedance of variable impedance network 14A and a desired voltage across variable impedance network 14A. In accordance with an embodiment in which programmable multistage digital potentiometer 14A has 256 taps, control/decoder block 12 extracts an 8-bit wiper address. Decoder 26 parses the 8-bit wiper address into segments that control stages 40 and 44 and switches $S_{MSBL}$ and $S_{MSBH}$ of variable impedance network 14A. As discussed above, an 8-bit wiper address is divided such that the most significant bit controls switches $S_{MSBL}$ and $S_{MBSH}$, the four least significant bits control the switches of the high resolution substages 40 and 60, and the three bit section between the most significant bit and the four least significant bits control switches of the medium range substages 52 and 62.

Thus, for a programmable multistage digital potentiometer having 256 taps, an 8-bit wiper address (WA[7]:WA[0]) controls the configuration of the switches of stages 40 and 44 and switches $S_{MSBL}$ and $S_{MSBH}$. High resolution stages 40 and 60 are controlled by the 4-bit LSB section (WA[3]:WA[0]) of the 8-bit wiper address. Preferably, stages 40 and 60 are substantially identical and are symmetrically positioned on each side of the bulk impedance $Z_B$. Stages 40 and 60 each comprise sixteen tapping switches and fifteen impedance elements. The medium resolution stages 52 and 62 are controlled by the middle-range 3-bit section (WA[6]:WA[4]) of the 8-bit wiper address. Like stages 40 and 60, preferably stages 52 and 62 are substantially identical and are symmetrically positioned on each side of the bulk impedance $Z_B$. Stages 52 and 62 each comprise seven shunt switches and seven resistors. In some embodiments, stages 52 and 62 include a dummy structure such as, for example, a resistor in parallel with a switch that is permanently on. Stage 42 is a low resolution stage comprising a bulk impedance $Z_B$ having a relative position with respect to the wiper and that is controlled by one bit, i.e., the most significant bit WA[7], of the 8-bit wiper address and switches $S_{MSBL}$ and $S_{MSBH}$. By way of example, when the wiper position is located on the lower half of variable impedance network 14A, switch $S_{MSBL}$ is on or closed and switch $S_{MSBH}$ is off or open and when the wiper position is located on the upper half of variable impedance network 14A, switch $S_{MSBL}$ is off or open and switch $S_{MSBH}$ is on or closed.

For the sake of completeness, FIGS. 4A and 4B illustrate the switch configurations for the switches $S_L(1)$ to $S_L(7)$, $S_{WL}(1)$ to $S_{WL}(16)$, $S_H(1)$ to $S_H(7)$, $S_{WH}(1)$ to $S_{WH}(16)$, $S_{MSBL}$, and $S_{MSBH}$ for various values of the variable k that represent the corresponding tap position of the common wiper terminal between taps 0 and 255. It should be noted that switch configurations indicated by the number 1 are closed and switch configurations indicated by the number 0 are open.

Figure 5A:
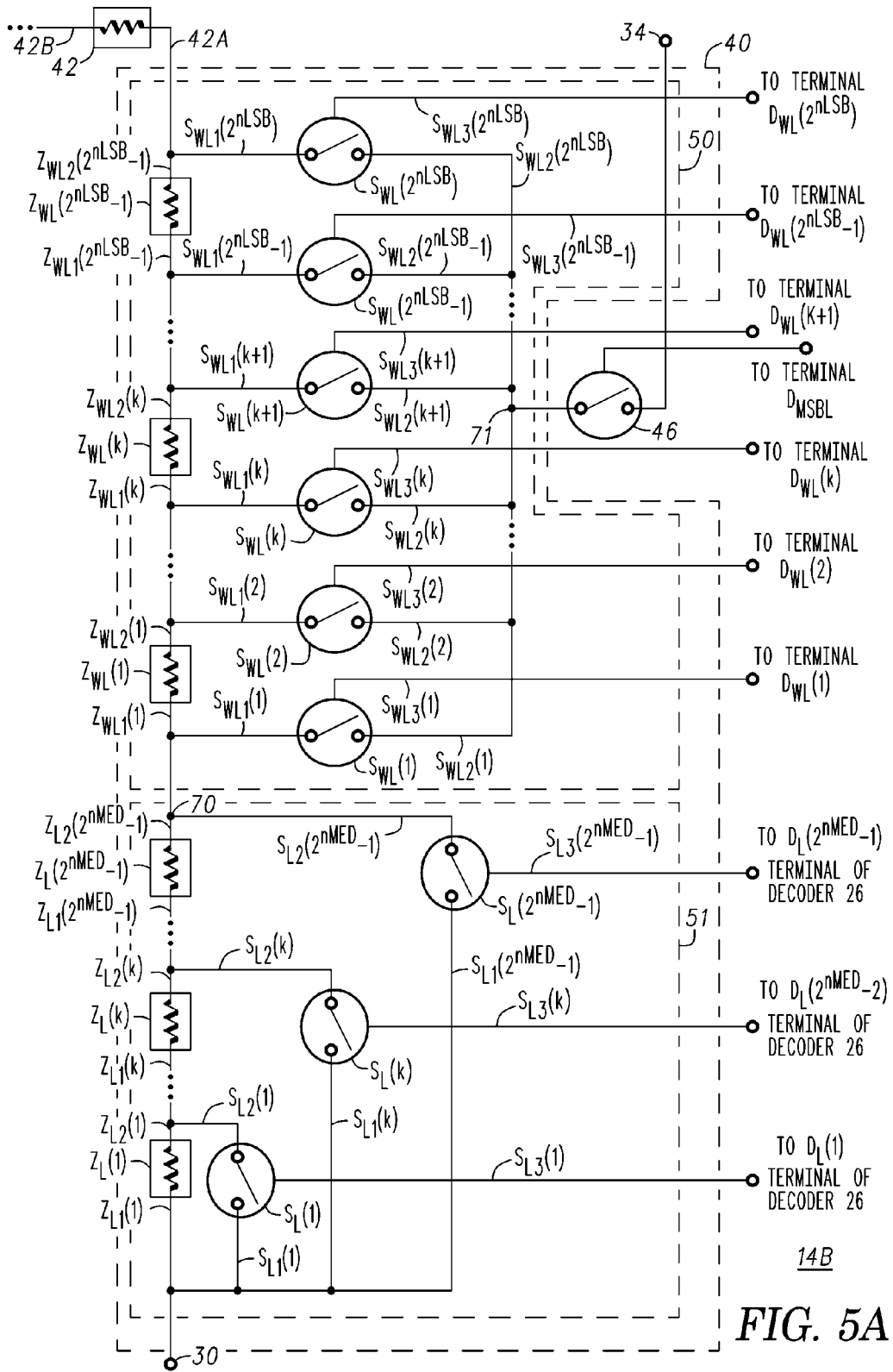
FIGS. 5A-5B are circuit schematics of a portion of the potentiometer of FIG. 1 in accordance with another embodiment of the present invention.
Figure 5B:
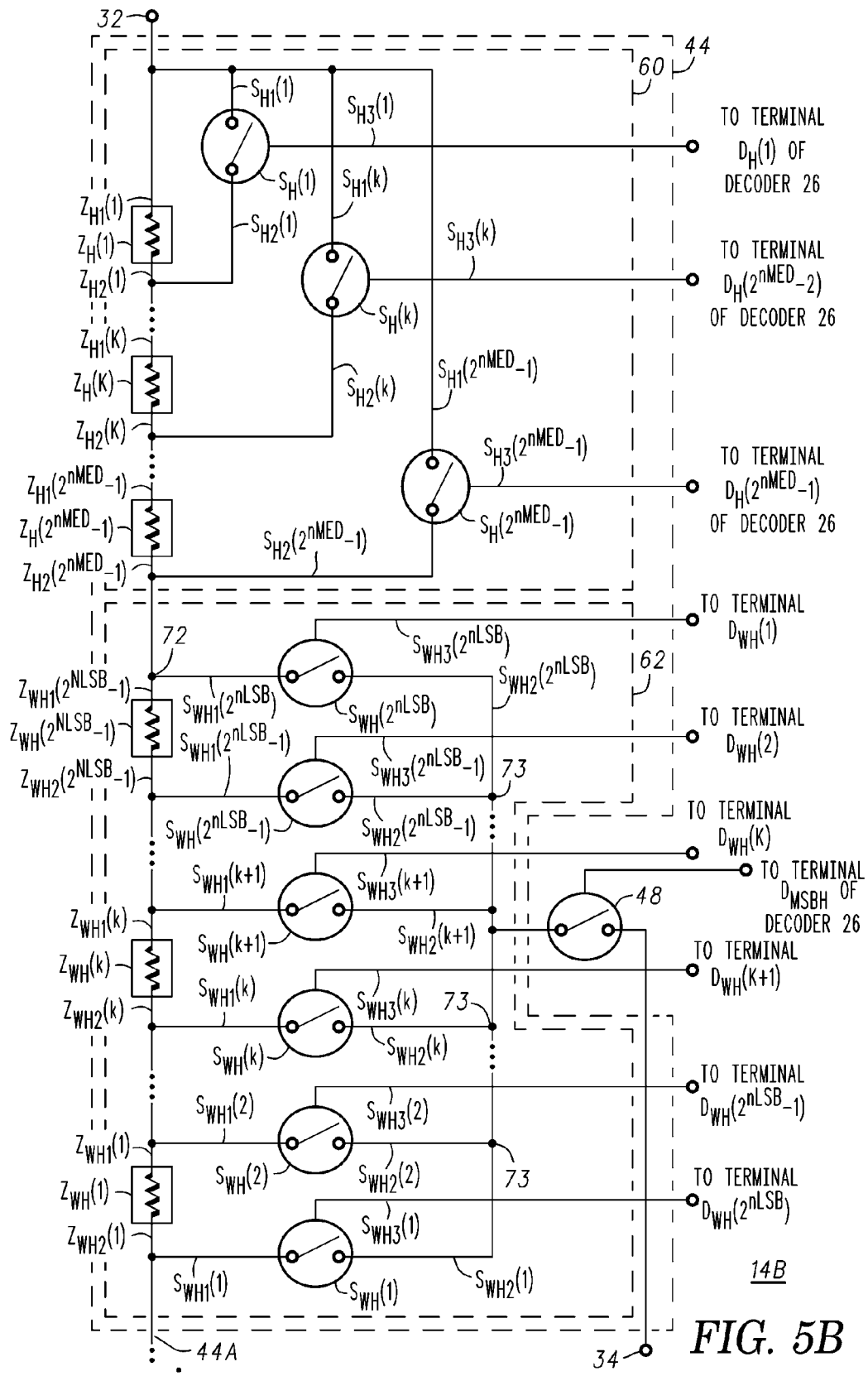

Referring now to FIGS. 5A and 5B, a circuit schematic of variable impedance network 14B is shown. It should be understood that FIG. 5A shows a portion of variable impedance network 14B and FIG. 5B shows another portion of variable impedance network 14B. Accordingly, FIGS. 5A and 5B together show an embodiment of variable impedance network 14 and are therefore described together. Variable impedance network 14B is similar to variable impedance network 14 except that dummy impedance structures $Z_{LD}$ and $Z_{HD}$ are not included in variable impedance network 14B. Accordingly, terminal $Z_{L1}(1)$ of impedance element $Z_L(1)$ is connected to or serves as terminal 30 and terminal $Z_{H1}(1)$ of impedance element $Z_H(1)$ is connected to or serves as terminal 32. The operation of variable impedance network 14B is similar to that of variable impedance network 14.

By now it should be appreciated that a programmable multistage digital potentiometer and a method for digitally adjusting an impedance have been provided. In accordance with embodiments of the present invention, the programmable multistage digital potentiometer is comprised of a plurality of stages connected as a string of stages and including a low resolution stage, two high resolution stages, and two medium resolution stages. The programmable multistage digital potentiometer receives an input signal and extracts an n-bit wiper address. A decoder circuit within the digital potentiometer assigns the bits to control the corresponding stages. The low resolution stages relative position with respect to the common wiper position is controlled by the most significant bit, divides the potentiometer into two portions, and is preferably positioned between a lower stage comprising a high resolution LSB stage and a medium resolution stage and a higher stage comprising another high resolution LSB stage and another medium resolution stage. Selecting the lowest value, i.e., 1-bit, for the lowest resolution stage minimizes the number of switches that are implemented, which lowers the area consumed by the switches and the cost of the potentiometer. By way of example, the low resolution MSB stage is composed of a single bulk resistor having a value equal to $(2^{nMED}-1)*2^{nLSB}+1)*R_0$, where $R_0$ is a resistance value of an impedance element.

Preferably, each high resolution LSB stage has a terminal connected to one terminal of the MSB stage, a terminal connected to the medium resolution stage, and a terminal connected to the wiper terminal. The high resolution LSB stages are comprised of a chain of $2^{nLSB}-1$ impedance elements and $2^{nLSB}$ switches connected between a high resolution wiper terminal and every node of the chain of impedance elements. A wiper switch is connected between the common wiper terminal and a high resolution wiper terminal.

Preferably each medium resolution stage is coupled between a corresponding variable impedance stage terminal and a high resolution LSB stage. In addition, each medium resolution stage is comprised of a chain of $2^{nMED}-1$ impedance elements where $2^{nMED}-2$ of them have substantially the same value and $2^{nMED}-1$ switches, where one current conducting terminal of each switch is coupled to a corresponding node of the chain of $2^{nMED}-1$ impedance elements and the other current conducting terminals are commonly connected together.

Optionally, each medium resolution stage further includes a dummy structure coupled to one of the impedance elements.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A potentiometer, comprising:
 first and second reference terminals and a common wiper terminal;
 a first stage comprising a non-shunted bulk impedance having first and second ends;
 a second stage comprising first and second impedance structures, the first impedance structure coupled to the first end of the non-shunted bulk impedance and the second impedance structure coupled to the second end of the non-shunted bulk impedance; and
 a third stage comprising third and fourth impedance structures, the third impedance structure coupled between the first impedance structure and the first reference terminal and the fourth impedance structure coupled between the second impedance structure and the second reference terminal.

2. The potentiometer of claim 1, wherein the first impedance structure comprises:
 a first impedance element having first and second terminals;
 a first plurality of switches, each switch of the first plurality of switches having a control terminal and first and second terminals, wherein the first terminal of a first switch of the first plurality of switches is coupled to the first terminal of a second switch of the first plurality of switches, the second terminal of the first switch of the first plurality of switches is coupled to the first terminal of the first impedance element and to the first end of the non-shunted bulk impedance, and the second terminal of the second switch of the first plurality of switches is coupled to the second terminal of the first impedance element.

3. The potentiometer of claim 2, further including a first wiper switch having a control terminal and first and second terminals, the first terminal coupled to the first terminals of the first and second switches of the first plurality of switches and the second terminal coupled to the common wiper terminal.

4. The potentiometer of claim 3, wherein the second impedance structure comprises:
   a second impedance element having first and second terminals;
   a second plurality of switches, each switch of the second plurality of switches having a control terminal and first and second terminals, wherein the first terminal of a first switch of the second plurality of switches is coupled to the first terminal of a second switch of the second plurality of switches, the second terminal of the first switch of the second plurality of switches is coupled to the first terminal of the second impedance element and to the second end of the non-shunted bulk impedance, and the second terminal of the second switch of the second plurality of switches is coupled to the second terminal of the second impedance element.

5. The potentiometer of claim 4, further including a second wiper switch having a control terminal and first and second terminals, the first terminal coupled to the first terminals of the first and second switches of the second plurality of switches and the second terminal coupled to the common wiper terminal.

6. The potentiometer of claim 5, wherein the third impedance structure comprises:
   a third impedance element having first and second terminals;
   a third plurality of switches, each switch of the third plurality of switches having a control terminal and first and second terminals, wherein the first terminal of a first switch of the third plurality of switches is coupled to the first terminal of a second switch of the third plurality of switches and to the first reference terminal, the second terminal of the first switch of the third plurality of switches is coupled to the first terminal of the third impedance element, and the second terminal of the second switch of the third plurality of switches is coupled to the second terminal of the third impedance element.

7. The potentiometer of claim 6, wherein the fourth impedance structure comprises:
   a fourth impedance element having first and second terminals;
   a fourth plurality of switches, each switch of the fourth plurality of switches having a control terminal and first and second terminals, wherein the first terminal of a first switch of the fourth plurality of switches is coupled to the first terminal of a second switch of the fourth plurality of switches and to the second reference terminal, the second terminal of the first switch of the third plurality of switches is coupled to the first terminal of the fourth impedance element, and the second terminal of the second switch of the fourth plurality of switches is coupled to the second terminal of the fourth impedance element.

8. The potentiometer of claim 1, wherein the third impedance structure of the third stage further includes a first dummy structure coupled to the first reference terminal.

9. The potentiometer of claim 1, wherein the fourth impedance structure of the third stage further includes a first dummy structure coupled to the second reference terminal.

10. The potentiometer of claim 1, wherein the first impedance structure comprises:
    a first string of impedance elements, wherein each impedance element of the first string of impedance elements has first and second terminals and wherein a second terminal of a first impedance element is coupled to a first terminal of a second impedance element; and
    a first plurality of switches wherein each switch of the first plurality of switches has first and second current conducting terminals and a control terminal, a first current conducting terminal of a first switch of the first plurality of switches coupled to the first terminal of the first impedance element, a first current conducting terminal of a second switch of the first plurality of switches coupled to the second terminal of the first impedance element and to the first terminal of the second impedance element and second current conducting terminals of the first and second switches of the first plurality of switches coupled together, the control terminal of the first switch of the first plurality of switches coupled for receiving a first signal and the control terminal of the second switch of the first plurality of switches coupled for receiving a second signal.

11. The potentiometer of claim 10, wherein the second impedance structure comprises:
    a second string of impedance elements, wherein each impedance element of the second string of impedance elements has first and second terminals and wherein a second terminal of a first impedance element of the second string of impedance elements is coupled to a first terminal of a second impedance element of the second string of impedance elements; and
    a second plurality of switches wherein each switch of the second plurality of switches has first and second current conducting terminals and a control terminal, a first current conducting terminal of a first switch of the second plurality of switches coupled to the first terminal of the first impedance element of the second string of impedance elements, a first current conducting terminal of a second switch of the second plurality of switches coupled to the second terminal of the first impedance element of the second string of impedance elements and to the first terminal of the second impedance element of the second string of impedance elements, and second current conducting terminals of the first and second switches of the second plurality of switches coupled together, the control terminal of the first switch of the second plurality of switches coupled for receiving a third signal and the control terminal of the second switch of the second plurality of switches coupled for receiving a fourth signal.

12. The potentiometer of claim 11, wherein the third impedance structure comprises:
    a third string of impedance elements, wherein each impedance element of the third string of impedance elements has first and second terminals and wherein a second terminal of a first impedance element of the third string of impedance elements is coupled to a first terminal of a second impedance element of the third string of impedance elements; and
    a third plurality of switches, wherein each switch of the third plurality of switches has first and second terminals and a control terminal, a first terminal of a first switch of the third plurality of switches coupled to the second terminal of the first impedance element of the third string of impedance elements, a first terminal of a second switch of the third plurality of switches coupled to the second terminal of the second impedance element of the third string of impedance elements, and second terminals of the first and second switches of the third plurality of switches coupled together, the control terminal of the first switch of the third plurality of switches coupled for receiving a fifth signal, the control terminal of the second switch of the second plurality of switches coupled for receiving a sixth signal, and the first terminal of the first impedance element of the third string of impedance elements coupled to the first reference terminal.

13. The potentiometer of claim 12, wherein the fourth impedance structure comprises:
a fourth string of impedance elements, wherein each impedance element of the fourth string of impedance elements has first and second terminals and wherein a second terminal of a first impedance element of the fourth string of impedance elements is coupled to a first terminal of a second impedance element of the fourth string of impedance elements; and
a fourth plurality of switches, wherein each switch of the fourth plurality of switches has first and second terminals and a control terminal, a first terminal of a first switch of the fourth plurality of switches coupled to the second terminal of the first impedance element of the fourth string of impedance elements, a first terminal of a second switch of the fourth plurality of switches coupled to the second terminal of the second impedance element of the fourth string of impedance elements, and second terminals of the first and second switches of the fourth plurality of switches coupled together, the control terminal of the first switch of the fourth plurality of switches coupled for receiving a seventh signal, the control terminal of the second switch of the second plurality of switches coupled for receiving an eighth signal, and the first terminal of the first impedance element of the fourth string of impedance elements coupled to the second reference terminal.

14. The potentiometer of claim 13, further including a first dummy structure coupled between the first terminal of the first impedance element of the third string of impedance elements and the first reference terminal, and a second dummy structure coupled between the first terminal of the first impedance element of the fourth string of impedance elements and the second reference terminal.

15. A method for digitally adjusting an impedance of a potentiometer having $2^n-1$ impedance elements coupled between first and second terminals and having $2^n$ wiper positions, comprising
providing an n-bit wiper address;
using first and third portions of the n-bit wiper address to control a relative position of a common wiper terminal with respect to two first resolution stages; and
using a second portion of the n-bit wiper address to control the relative position of the common wiper terminal with respect to two second resolution stages.

16. The method of claim 15, wherein:
using the first portion of the n-bit wiper address comprises using the most significant bit of the n-bit wiper address to control the relative position of the common wiper terminal with respect to the two first resolution stages;
using the second portion of the n-bit wiper address comprising using a first plurality of bits of the n-bit wiper address to control the relative position of the common wiper terminal with respect to the two second resolution stages.

17. A method for digitally adjusting an impedance of a digital potentiometer having $2^n-1$ impedance elements coupled between first and second terminals and having $2^n$ wiper positions, comprising:
providing two first resolution stages, each first resolution stage having first, second, and third terminals, the third terminals of the two first resolution stages coupled together to form a common wiper terminal;
providing two second resolution stages, each second resolution stage having first and second terminals, the first terminal of one of the second resolution stages coupled to the first terminal of one of the first resolution stages, and the first terminal of the other second resolution stage coupled to the first terminal of other first resolution stage;
providing an impedance stage having first and second terminals, the first and second terminals of the impedance stage coupled to the second terminals of the first resolution stages;
using at least one least significant bit and one most significant of an n-bit signal to control the relative position of the common wiper terminal with respect to the first resolution stage; and
using a first plurality of bits of the n-bit signal to control the relative position of two common wiper terminals with respect to the second resolution stages.

18. A method for digitally adjusting an impedance of a digital potentiometer having $2^n-1$ impedance elements coupled between first and second terminals and having $2^n$ wiper positions, comprising:
providing a first resolution stage having first and second terminals;
providing a second resolution having first and second terminals, the first terminal of the second resolution stage coupled to the first terminal of the first resolution;
using at least one bit and one of an n-bit signal to control the relative position of a common wiper terminal with respect to the first resolution stage;
using a first plurality of bits of the n-bit signal to control the relative position of a common wiper terminal with respect to the second resolution stage; and further including providing a third resolution stage having first and second terminals, the first terminal of the third resolution stage coupled to the second terminal of the first resolution stage and using a second plurality of bits of the n-bit signal to control the relative position of the common wiper terminal with respect to the third resolution stage.

19. The method of claim 18, further including:
providing a third resolution stage having first and second terminals, the first terminal of the third resolution stage coupled to the second terminal of the first resolution stage and using the first plurality of bits of the n-bit signal to control the relative position of the common wiper terminal with respect to the third resolution stage;
providing fourth and fifth resolution stages each having first and second terminals;
coupling the first terminal of the fourth resolution stage to the second terminal of the second resolution stage;
coupling the first terminal of the fifth resolution stage to the second terminal of the third resolution stage; and
using a second plurality of bits of the n-bit signal to control the fourth and fifth resolution stages.

20. The method of claim 19, wherein the at least one bit is a most significant bit of the n-bit signal, the first plurality of bits comprises at least the least significant bit and the penultimate least significant bits of the n-bit signal, and the second plurality of bits comprises bits of the n-bit signal that are between the most significant bit and the penultimate least significant bit of the n-bit signal.

21. The method of claim 20, wherein the second and third resolution stages are substantially the same and the fourth and fifth resolution stages are substantially the same.

22. The method of claim 21, wherein the first resolution stage comprises a non-shunted impedance, the second resolution stage comprises a first string of impedances and the third resolution stage comprises a second string of impedances.

23. The method of claim 22, further including using first and second switches to select one of the second and fourth resolution stages or the third and fifth resolution stages.

24. The method of claim 22, wherein the second resolution stage further includes a first plurality of switches, the third resolution stage further includes a second plurality of switches, the fourth resolution stage further includes a third plurality of switches and the fifth resolution stage further includes a fourth plurality of switches, and further including using the first plurality of bits to control the first plurality of switches and using the second plurality of bits to control the third plurality of switches.

* * * * *